(12) United States Patent
Hayashi

(10) Patent No.: US 6,191,367 B1
(45) Date of Patent: *Feb. 20, 2001

(54) WIRING CONSTRUCTION BODY WITH CONDUCTIVE LINES IN A RESIN BINDER

(75) Inventor: Satoru Hayashi, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/605,863

(22) Filed: Feb. 23, 1996

(30) Foreign Application Priority Data

Mar. 3, 1995 (JP) .................................... 7-044648

(51) Int. Cl.$^7$ ....................................... H05K 1/16
(52) U.S. Cl. .................. 174/260; 174/262; 174/251; 174/261
(58) Field of Search ................... 174/260, 262, 174/259, 251, 264, 265, 261, 268; 361/792, 793

(56) References Cited

U.S. PATENT DOCUMENTS

| | | | |
|---|---|---|---|
| 3,290,756 | * 12/1966 | Dreyer | 29/832 |
| 4,295,183 | * 10/1981 | Miersch et al. | 361/767 |
| 4,606,787 | 8/1986 | Pelligrino | 156/632 |
| 4,912,020 | 3/1990 | King et al. | 430/311 |
| 5,002,367 | 3/1991 | Nicholas . | |
| 5,046,953 | * 9/1991 | Shreeve et al. | 439/66 |
| 5,479,319 | * 12/1995 | Werther | 361/784 |
| 5,483,421 | * 1/1996 | Gedney et al. | 361/771 |
| 5,574,630 | * 11/1996 | Kresge et al. | 361/792 |

FOREIGN PATENT DOCUMENTS

| | | |
|---|---|---|
| 59-175788 | 10/1984 | (JP) . |
| 61-170091 | 7/1986 | (JP) . |
| 61-287198 | 12/1986 | (JP) . |
| 62-2589 | 1/1987 | (JP) . |
| 62-49264 | 3/1987 | (JP) . |
| 62-73794 | 4/1987 | (JP) . |
| 1-059989 | 3/1989 | (JP) . |
| 1-081396 | 3/1989 | (JP) . |
| 3-178432 | 8/1991 | (JP) . |
| 5-029770 | 2/1993 | (JP) . |

OTHER PUBLICATIONS

Patent Abstracts of Japan, No. 4–65893, Mar. 2, 1992.

Patent Abstracts of Japan, No. 4–71284, Mar. 5, 1992.

Patent Abstracts of Japan, No. 1–307293, Dec. 12, 1989.

Patent Abstracts of Japan, No. 2–24012, Jan. 26, 1990.

* cited by examiner

*Primary Examiner*—Jeffrey Gaffin
*Assistant Examiner*—Kamand Cuneo
(74) *Attorney, Agent, or Firm*—Sughrue, Mion, Zinn, Macpeak & Seas, PLLC

(57) ABSTRACT

A wiring construction body has one or more circuit conductors having specified patterns. These circuit patterns are made by forming groove sections in one or more of the circuit conductors which are made of highly conductive electric materials, i.e., copper, which are in a layer form. The wiring construction body is then formed by filling the groove sections in the circuit conductors with an insulating resin to integrate, or mechanically fix, the circuit patterns in the wiring construction body. In addition, the circuit patterns are formed in the wiring construction body so as to be exposed on at least two surfaces of the wiring construction body. The wiring construction body can also be used with a circuit board.

16 Claims, 18 Drawing Sheets

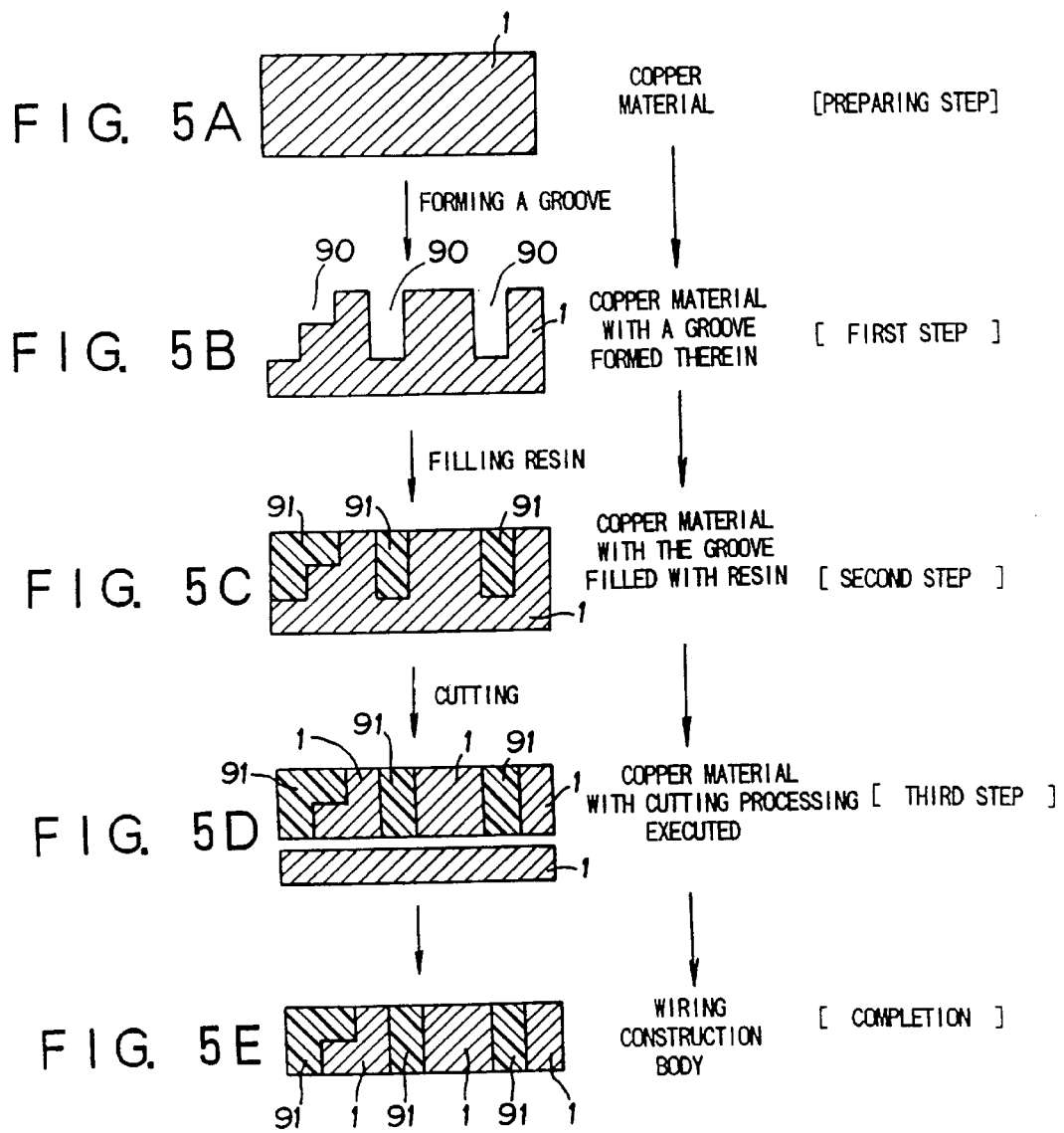

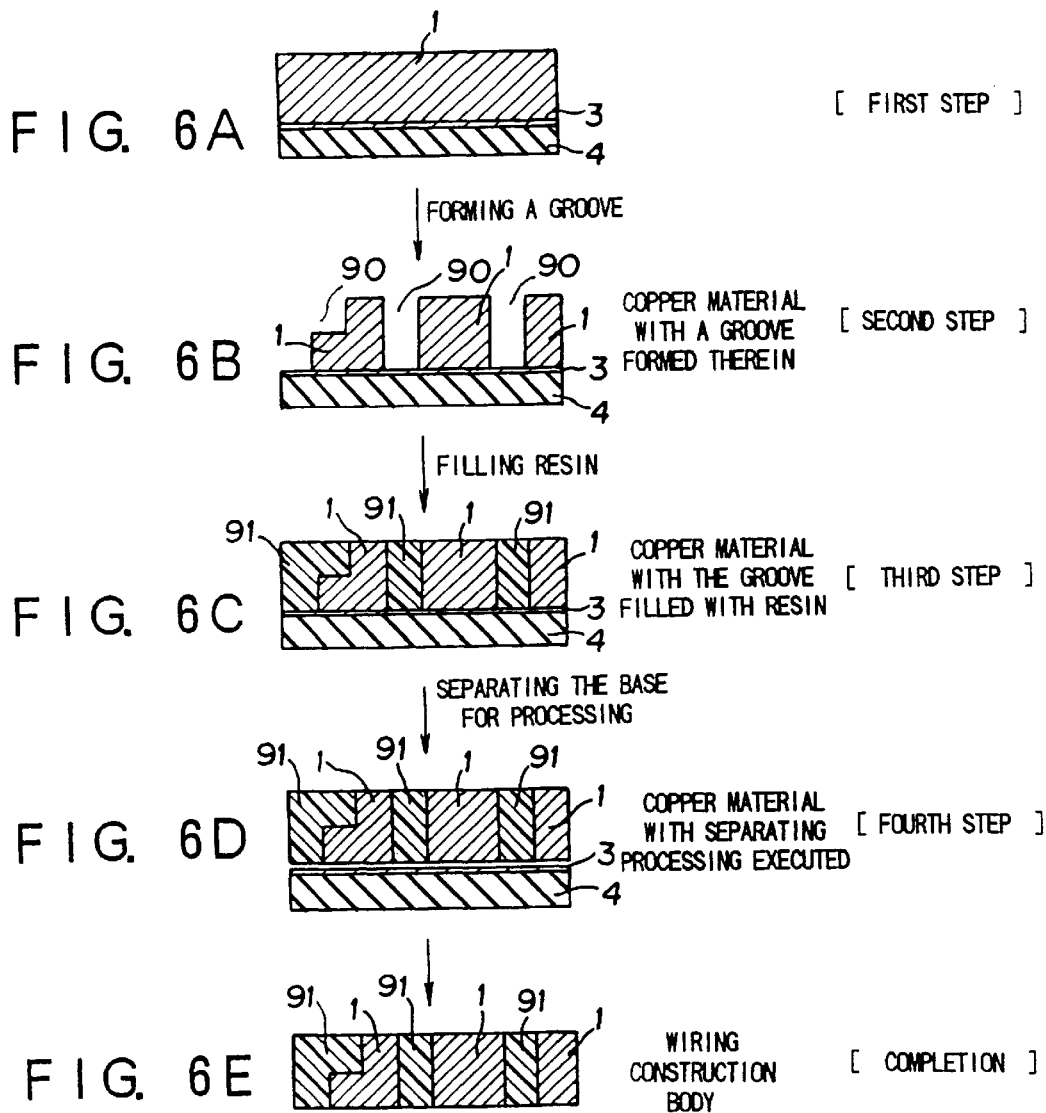

[ FIRST STEP ]

↓ FORMING A GROOVE

[ SECOND STEP ]

↓ FILLING RESIN

[ THIRD STEP ]

↓ SEPARATING THE BASE FOR PROCESSING

[ FOURTH STEP ]

↓

[ COMPLETION ]

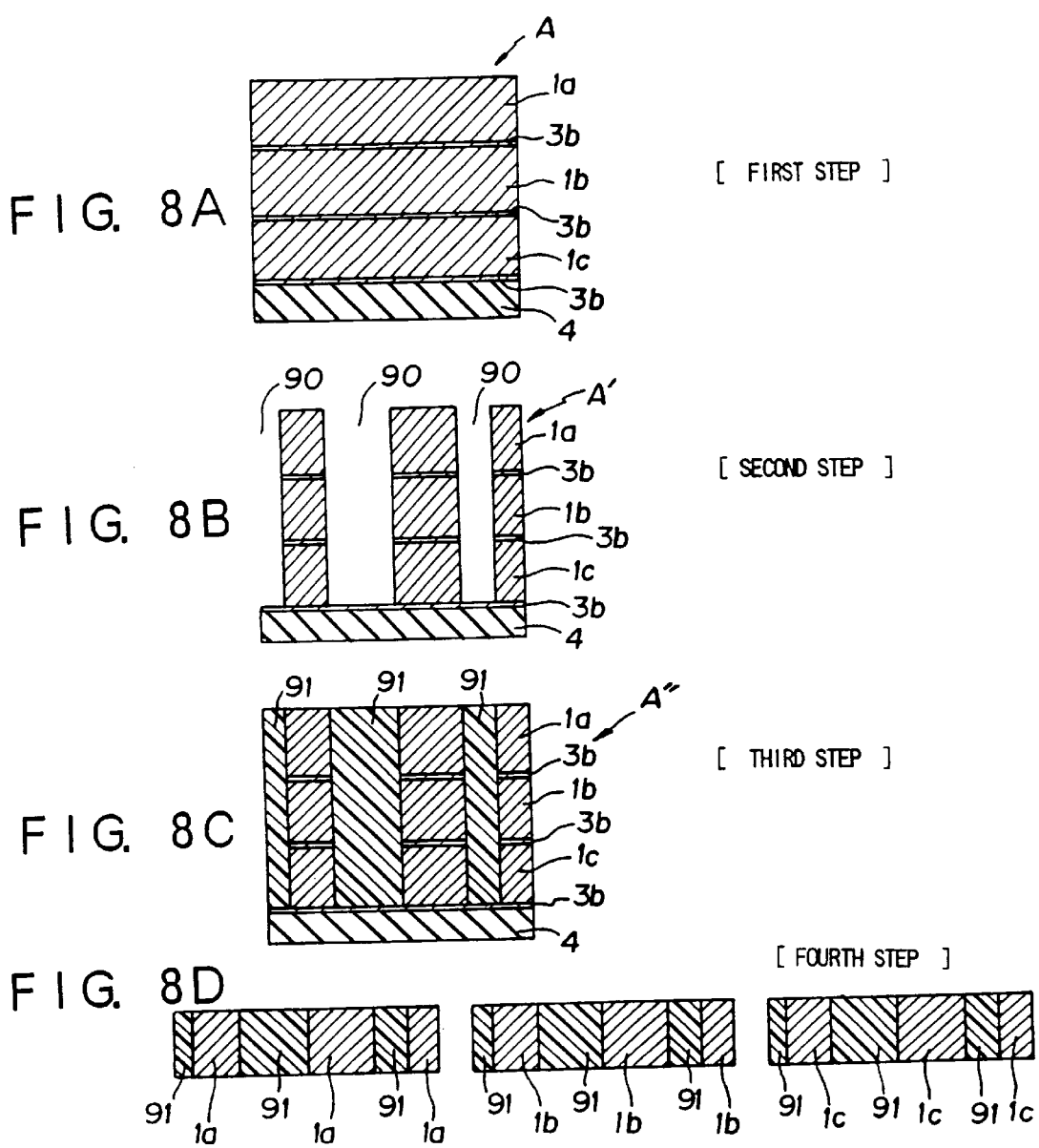

[ FIRST STEP ]

[ SECOND STEP ]

[ THIRD STEP ]

[ FOURTH STEP ]

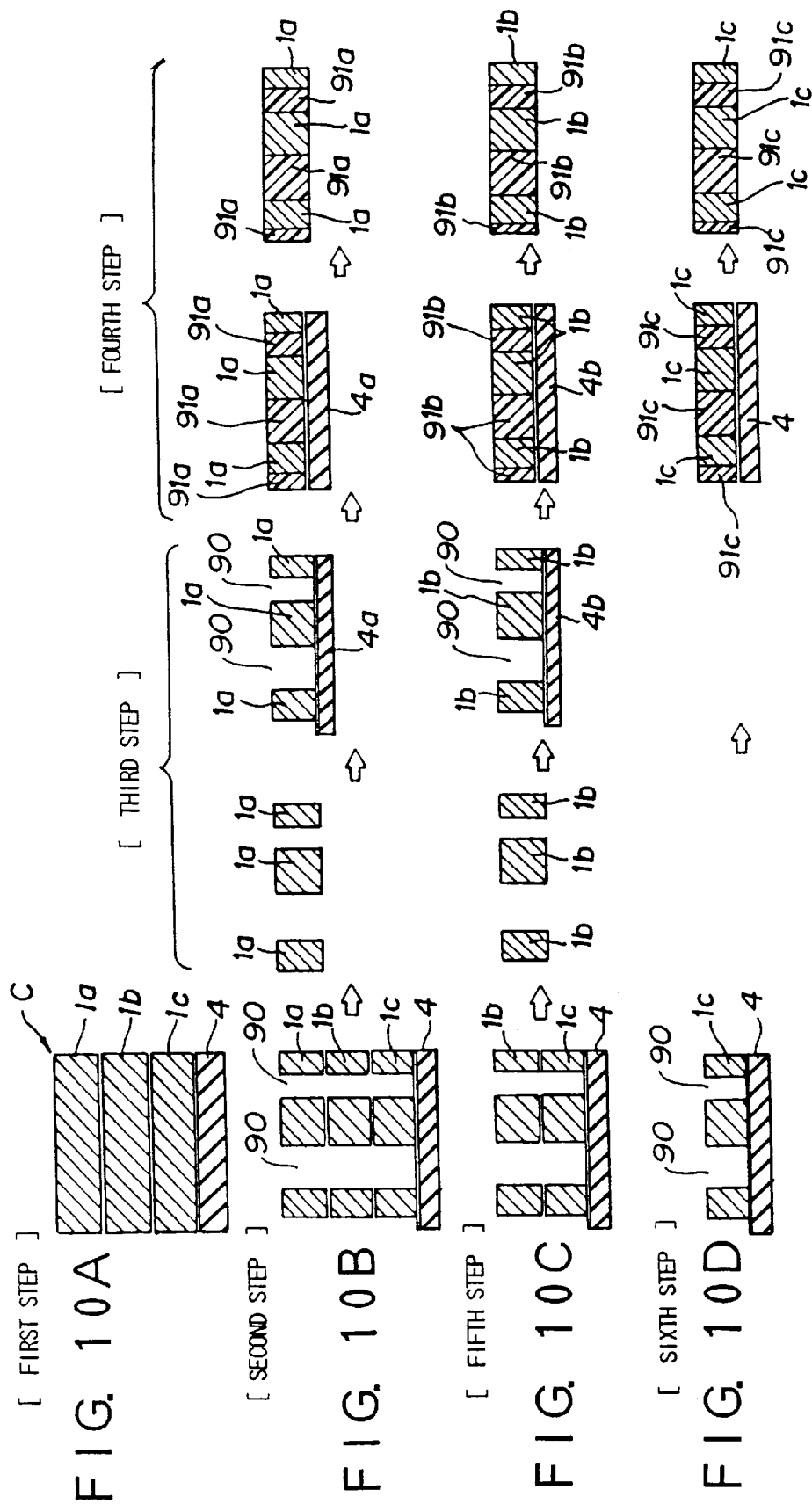

INSENSITY IN CUTTING UNDER SEVERAL TEMPERATURE
 HARDENING : 48 HOURS UNDER 23°C
 MEASUREMENT: AFTER LEAVED FOR 10 MINUTES IN EACH MEASURED TEMPERATURE
          MEASURED TEMPERATURE

WIRING CONSTRUCTION BODY WITH CONDUCTIVE LINES IN A RESIN BINDER

FIELD OF THE INVENTION

The present invention relates to a wiring construction body made from thick conductors to which a large current can be applied and which is used in electronic control devices such as an inverter or a servo, a method of manufacturing the same, and a circuit board using the wiring construction body.

BACKGROUND OF THE INVENTION

In electronic control devices such as an inverter or a servo, the electronic control function is realized by integrating various types of active components and passive components on a circuit board. Especially in such electronic control devices such as an inverter or a servo, power control is executed by using a large capacity diode, a transistor, or the like.

The conventionally, so-called DBC substrate or metal substrate, has been used as a substrate for a circuit using semiconductor elements emitting a large quantity of heat such as those for power. The DBC substrate comprises ceramics and a conductive material, with such materials as alumina ceramics and aluminum nitride ceramics used for the ceramic insulating material. Also copper is often used as a conductor in the DBC substrate, and the thickness is 0.3 mm in the typical specification.

On the other hand, as a metal base substrate, a circuit conductor is formed via an insulating layer made of an organic insulating material on a top surface of a base metal plate, and generally such metals as aluminum, copper, or iron are used as the material. In the conductor formed on a metal base substrate, generally a thickness of copper foil is around 0.1 mm, and a circuit on the substrate is generally formed by means of etching.

However, the etching system described above is suited to mass production because, for instance, a mask is manufactured, but it causes increase of cost when producing many types of product in a small lot respectively. In addition, when a conductor pattern is formed by etching, the thickness of the conductor becomes larger because of effects by side etching with the pattern precision lowered, and furthermore when mounting a bare chip on a substrate, a heat spreader is often used, which in turn results in increase of required parts.

Also when a thickness of a conductor becomes larger, it becomes difficult to form a fine pattern such as a control circuit due to side etching. Furthermore as a conductor's thickness is at most around 0.3 mm, there is a limit in amplitude of a current applied to the circuit, which makes it impossible to apply a large current, and even if a thickness of a conductor is made larger, sometimes such defects as warping occur in the substrate.

SUMMARY OF THE INVENTION

It is an object of the present invention to provide a wiring construction body which has an excellent pattern precision even though the thickness of conductor is large, which allows a control current and a large current to be applied. It is a further object to provide a wiring construction body which enables production of various types of product in a small lot, in which defects such as warping rarely occur, and which can be incorporated with a small number of parts, a method of manufacturing the same, and a circuit board using the wiring construction body.

In a wiring construction body according to an embodiment of the present invention, one or a plurality of circuit pattern conductors each formed into a prespecified form are mechanically jointed to each other with insulating resin and circuit patterns are formed on two surfaces thereof, so that precision of the circuit pattern is high and a control current and a large current can be applied thereto. Also, it is possible to form a desired circuit pattern, to insulate each individual circuit conductor and integrate them, as well as to electrically connect an upper surface of the wiring construction body to a bottom surface thereof easily.

In a wiring construction body according to another embodiment of the present invention, an insulating base is adhered to one of the two surfaces on which circuit patterns are formed, so that rigidity of the wiring construction body can be strengthened and also as an insulating base for fixing is used, one surface of the wiring construction body can be insulated.

In a wiring construction body according to another embodiment of the present invention, an insulating coating is adhered to one of the two surfaces or both surfaces on which circuit patterns are formed, so that rigidity of the wiring construction body can be strengthened, and an area of joint by soldering can be controlled, and furthermore, moisture resistance can be improved.

In a circuit board using the wiring construction body according to another embodiment of the present invention, one or a plurality of circuit pattern conductors each formed into a prespecified form mechanically connected to each other with insulating resin are provided and in which the circuit patterns are formed on two surfaces, the wiring construction body with the plurality of circuit pattern integrated to each other therein is electrically connected, or electrically connected and mechanically fixed to a printed circuit board, so that dimensional precision in forming patterns is improved, and also a large current section applies the wiring construction body formed by improving precision of the thick material with high electric conductivity and high-precision circuit board for a fine-pattern as well as a large current pattern can be formed by electrically connecting both of them to each other.

In a circuit board using the wiring construction body according to another embodiment of the present invention, a prespecified circuit pattern is formed by forming a groove section in a plurality of materials with high electric conductivity, the materials with high electric conductivity are provided in a plane form, the insulating resin is filled in the groove section formed with the materials with high electric conductivity, and the wiring construction body with the plurality of materials with high electric conductivity integrated to each other is electrically connected, or electrically connected and mechanically fixed to a printed circuit board so that a portion of the materials with high electric conductivity will protrude from an external periphery of the wiring construction body, so that a range where the wiring construction body and a circuit board can be applied is expanded, and also a number of required parts can be reduced.

In a circuit board using the wiring construction body according to another embodiment of the present invention, a bare chip is directly jointed to a conductor section of the wiring construction body, so that a heat spreader in a portion in which the bare chip is incorporated in the large current section is not required, and a number of parts can be reduced.

In a circuit board using the wiring construction body according to another embodiment of the present invention, a portion of or the entire section of the wiring construction body is a molded, so that warping in the board is reduced by adding thereto rigidity due to the molded material, which makes it possible to form high-reliability wiring construction body as well as circuit board.

Other objects and features of this invention will become understood from the following description with reference to the accompanying drawings.

BRIEF DESCRIPTION OF THE DRAWINGS

FIGS. 5A to 5E are simulated manufacturing process diagrams showing steps of manufacturing the wiring construction body according to a fourth embodiment;

FIGS. 6A to 6E are simulated manufacturing process diagrams showing steps of manufacturing the wiring construction body according to a fifth, sixteenth, seventeenth, eighteenth and nineteenth embodiment;

FIGS. 8A to 8D are simulated manufacturing process diagrams showing steps of manufacturing the wiring construction body according to a seventh embodiment;

FIGS. 10A to 10D are simulated manufacturing process diagrams showing steps of manufacturing the wiring construction body according to a tenth embodiment;

DESCRIPTION OF THE PREFERRED EMBODIMENTS

Detailed description is made for embodiments of wiring construction body according to the present invention, a method of manufacturing the same, and circuit board using the wiring construction body with reference to the related drawings.

Figure 1A:
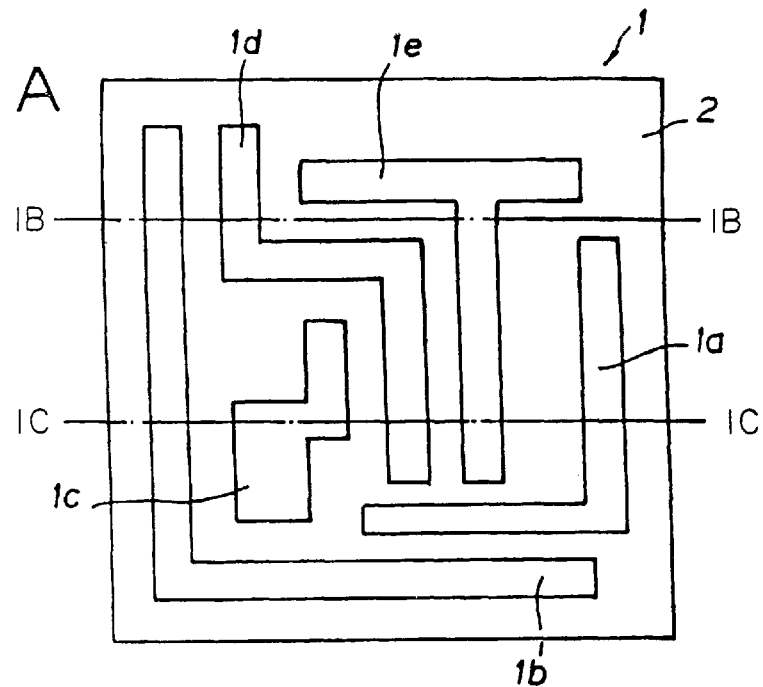
FIG. 1A is a plan view showing a wiring construction body according to a first embodiment the present invention.
Figure 1B:
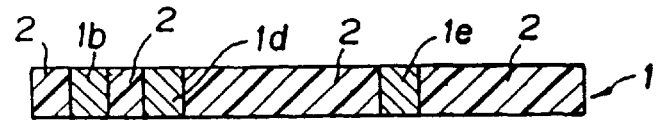
FIG. 1B is a cross-sectional view showing the wiring construction body shown in FIG. 1A which is cut along the line A—A'.
Figure 1C:
FIG. 1C is a cross-sectional view showing the wiring construction body shown in FIG. 1A which is cut along the line B—B'.

At first description is made for Embodiment 1 of the present invention. FIG. 1A is a plan view showing a wiring construction body according to Embodiment 1 of the present invention. FIG. 1B is a cross-sectional view showing a case where the wiring construction body 1 shown in FIG. 1A is cut along the line 1B—1B', and FIG. 1C is a cross-sectional view showing a case where the wiring construction body 1 shown in FIG. 1A along the line 1C—1C'.

In FIG. 1A, the reference numerals 1a, 1b, 1c, 1d, and 1e indicate a copper material which is a material with high electric conductivity respectively, and the copper material is used for a circuit pattern conductor having a prespecified form. Each of the copper materials 1a, 1b, 1c, 1d and 1e is previously processed into a form suited for forming a circuit pattern as a conductor for the wiring construction body 1. In the present embodiment, the thickness of the copper materials 1a, 1b, 1c, 1d, and 1e is uniform. However, the thickness may not always be uniform, and each circuit pattern conductor has a different thickness.

The wiring construction body 1 is formed by providing the circuit pattern conductors (copper materials 1a, 1b, 1c, 1d, and 1e) at specified positions respectively, filling insulating resin 2 in a gap between the circuit pattern conductor and other circuit pattern conductors or an area around the gap, and adhering and integrating the copper materials 1a, 1b, 1c, 1d, and 1e so that two opposing side faces of adjoining ones among the copper materials 1a, 1b, 1c, 1d, and 1e are mechanically jointed to each other by the insulating resin a.

The present embodiment assumes a case where all gaps between the circuit pattern conductors are completely filled with the insulating resin 2, but it is not always necessary to fill the insulating resin 2 in all the gaps between the circuit pattern conductors, and what is required is that two opposing side faces of adjoining ones among the copper materials 1a, 1b, 1c, 1d, and 1e are adhered and integrated to each other.

There is no specific restriction over a thickness of a circuit pattern conductor, namely a thickness of a copper material on the condition that it is enough to constitute a conductor circuit, but the capacity for an energizing current relates to a cross section of a circuit pattern conductor, and for instance, in a case where a thickness is in a range from 0.1 mm to 5.0 mm and a width of a circuit pattern conductor is 1 mm, the cross section is in a range from 0.5 mm$^2$ to 5.0 mm$^2$. For example, if it is assumed that the energizing current per 1 mm$^2$ is in a range from 5 A to 15 A, a current in a range from around 0.25 A to 75 A can be applied thereto. Furthermore, if a width of a circuit pattern conductor is made larger, a substantially large current of around 500 A can be applied thereto.

There are several restrictions concerning processability of a circuit pattern conductor, but circuit pattern can be formed into a desired form by machining, pressing, electric discharge machining, laser machining or the like, and various types of electric connection with circuit parts are possible according to the form. Also an upper surface of the wiring construction body 1 can electrically be connected to a lower surface thereof.

Figure 2:
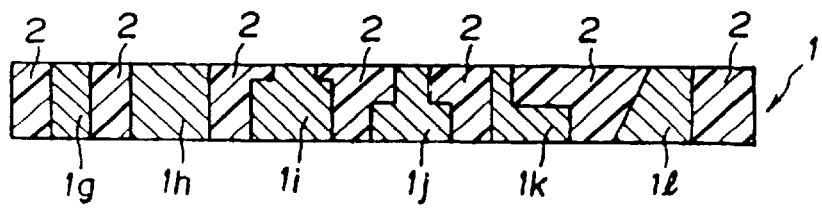
FIG. 2 is a cross-sectional view showing the wiring construction body shown in FIG. 1.

FIG. 2 shows structure of another cross section of the wiring construction body 1 corresponding to FIG. 1B or FIG. 1C, and like in FIGS. 1A to 1C, also in FIG. 2 the reference numerals 1 g to 1 l indicate a circuit pattern conductor having a specified form, which is a material with high electric conductivity, respectively, and the reference numeral 2 indicates insulating resin filled in the gaps between the conductors. A form of a cross section of each of the circuit patterns 1 g to 1 l may be non-uniform as shown, for instance, in the figure, namely a form where the two opposing side faces may be different. Also a form of a cross section of each circuit pattern conductor is not always limited to that shown in FIG. 2, and any form is allowable according to circuit parts electrically connected thereto on the condition that it can be adhered to a side face of the conductor.

With the present invention, the configuration as described above is employed, so that a precision of a circuit pattern is high, a control current as well as a large current can be applied thereto, and incorporation with a small number of parts can be realized. Also it is possible to form a desired circuit pattern, to insulate each discrete circuit conductors and integrate them, and also to electrically connect an upper surface of the wiring construction body to a bottom surface thereof easily.

Figure 3:
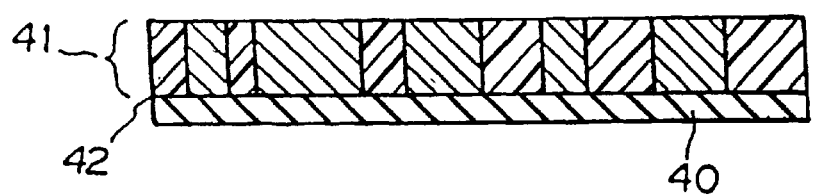
FIG. 3 is an explanatory view showing a second embodiment where the wiring construction body is fixed to a base after the body according to the present invention has been prepared.

Next, a description is made for Embodiment 2 of the present invention. FIG. 3 is an explanatory view showing a state where a wiring construction body 41 has been manufactured according to the manufacturing method described in each of the embodiments below and then fixed to a base, and in this figure, the reference numeral 40 indicates a base for fixing comprising an insulating plate. The base for fixing 40 is previously adhered or mechanically fixed to the wiring construction body 41 using adhesive 42. It should be noted that, although a case where the base for fixing 40 is adhered to the wiring construction body 41 is shown in the example shown in FIG. 3, insulating resin may be placed on the base for fixing 40. Also, although a case where the base for fixing 40 comprises an insulating plate is shown in the example shown in FIG. 3, a circuit board with a circuit pattern having been formed may be electrically connected and adhered or mechanically fixed to the wiring construction body 41.

With the present invention, rigidity of the wiring construction body 41 can be strengthened by connecting the base for fixing 40 thereto, and also one surface of the wiring construction body 41 can be insulated by using the base for fixing 40 having an insulating capability, so that the wiring construction body 41 can be contacted and fixed to a conductive heat-emitting fin or the like.

Figure 4:
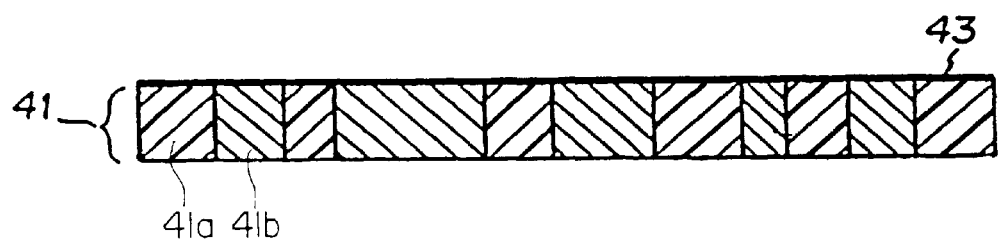
FIG. 4 is an explanatory view showing a third embodiment where a surface of the wiring construction body is subjected to coating after the body according to the present invention has been prepared.

Next, a description is made for Embodiment 3 of the present invention. FIG. 4 is an explanatory view showing a state where the wiring construction body 41 is manufactured according to each of the manufacturing methods described later and then coating has been executed to a surface of the wiring construction body 41, and in this figure, the reference numeral 43 indicates a coating agent. Generally, if a difference between height of a circuit pattern conductor section 41b and that of an insulating material is around 0.1 mm or more, it is difficult to execute coating, but in this embodiment, insulating resin 41a is filled in a gap between the conductors 41b, and by adjusting the filling height so that it is aligned with the surface of the conductor 41b, application of coating agent is quite easy. It should be noted that an area for coating is not necessarily limited to one surface, and coating may be executed to required portions of both surfaces.

With the present embodiment, the insulating capability of the wiring construction body 41 can be strengthened by applying a coating agent 43, and also the range of confinement of soldered joints can be controlled, and furthermore the moisture resistance can be improved.

Next, a description is made for Embodiment 4. FIG. 5A to FIG. 5E are views each showing a process flow in a method of manufacturing the wiring construction body according to Embodiment 4. Detailed description thereof is made below with reference to the related drawings.

(1) Preparing Step

As shown in FIG. 5A, in a preparing step, at first, a copper material 1 (thickness: 20 mm, length: 100 mm, width: 80 mm) which is a material with high electric conductivity used for forming as a circuit pattern conductor is prepared, and is set in a milling machine (not shown herein).

(2) First Step

As shown in 5B, as a first step, for instance, a groove section 90 (depth: 2.0 mm) is formed in the copper material 1 as a copper material with a groove formed therein with an end mill (not shown herein: machining diameter: φ 1.0 mm).

(3) Second Step

As shown in FIG. 5C, as a second step, epoxy resin 91 (YZ3727/YH3724: produced by Ryoden Kasei), which is in a liquid phase under the room temperature, is poured to a portion of the grooved section 90, and is heated for curing for 2 hours under the temperature of 140° C. to form a copper material with the groove filled with resin is formed.

(4) Third Step

As shown in FIG. 5D, the copper material with the groove filled with resin is cut at a position 1.0 mm apart from a process edge face with a surface perpendicular to a direction of depth of the groove section 90, and the wiring construction body as shown in FIG. 5E can be obtained.

It should be noted that, although description of the embodiment assumes employment of milling as processing for forming a groove, but the processing is nbt limited to milling, and the same effects as those described above can be obtained even if any of other processing methods such as electric discharge machining or laser machining or the like is employed.

With the present embodiment, a groove is formed by milling the copper material 1 which is a thick material with high electric conductivity, so that there is no effects due to side etching like in a case where a pattern is formed by etching the copper material 1 over circuit patterns, the dimensional precision in forming circuit patterns becomes higher, and a groove therein can easily be formed, which makes it possible to form a desired circuit pattern.

Also epoxy resin 91 is poured into the groove section 90 formed in the copper material 1, and the copper material with a groove formed therein as described above is cut with a surface perpendicular to a direction of depth of the groove section 90, so that circuit patterns formed with grooves can be integrated to each other in such a stable state that circuit patterns are not dispersed from each other with no positional displacement of generated therein, a conductor pattern separated from the peripheral conductors by forming grooves therein can be insulated as a circuit pattern and at the same time all of the conductor patterns can be integrated to each other by adhering them to each other, which makes it possible to obtain a wiring construction body to which a large current can be applied.

Next, a description is made for Embodiment 5. FIG. 6A to FIG. 6E are views each showing a process flow in a method of manufacturing a wiring construction body according to Embodiment 5. Detailed description thereof is made below with reference to the related drawings.

(1) First Step

As shown in FIG. 6A, at first, as a first step, a copper material 1 (thickness: 0.5 mm, length: 100 mm, width: 80 mm) which is a material with high electric conductivity used for forming a circuit pattern is fixed to a base for processing 4 made of aluminum (A5052: thickness: 20 mm, length: 100 mm, width: 80 mm) by using adhesive 3. In this embodiment, a double-faced adhesive material (No. 1650: produced by Three Bonds) is used as adhesive 3.

(2) Second Step

As shown in FIG. 6B, as a second step, the copper material 1 fixed to the base for processing 4 is set in a milling machine, and a groove section 90 (depth: 0.7 mm) with a form of a cross section as shown in the figure as a copper material with a groove formed therein is formed in the copper material 1 with an end mill (machining diameter: φ 1.0 mm).

(3) Third Step

As shown in FIG. 6C, as a third step, epoxy (potting) resin 91 (YZ3727/YH3724: produced by Ryoden Kasei), which is in a liquid phase under the room temperature, is poured into the groove section 90 formed therein, and is heated for curing for 2 hours under the temperature of 140° C. The liquid-phase epoxy resin 91 has low adhesion, so that the epoxy resin can easily be poured into the groove section 90, the circuit pattern conductors are fixed by being heated for curing, the conductors (copper materials 1) can be insulated from each other, and can be integrated to each other.

(4) Fourth Step

As shown in FIG. 6D, as a fourth step, the wiring construction body as shown in FIG. 6E can be completed by separating the wiring construction body from the base for processing 4.

With the present embodiment, effects like those in Embodiment 1 as described above can be obtained, and at the same time, the copper material 1 and the base for processing 4 are adhered to each other with the adhesive 3, so that separation between the base for processing 4 and the wiring construction body becomes easier in the fourth step, which makes it possible to improve the workability thereof.

Next, a description is made for Embodiment 6. FIG. 7A to FIG. 7E are views each showing a process flow in the method of manufacturing a wiring construction body according to Embodiment 6. Detailed description is made below with reference to the related drawings.

(1) First Step

Figure 7A:
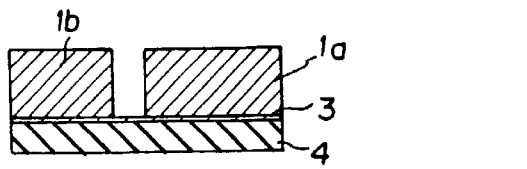
FIGS. 7A to 7E are simulated manufacturing process diagrams showing steps of manufacturing the wiring construction body according to a sixth embodiment.

As shown in FIG. 7A, at first, as a first step, a copper material 1a (thickness: 0.1 mm, length: 60 mm, width: 20 mm) as well as a copper material 1b (thickness: 0.1 mm, length: 25 mm, width: 80 mm) which are materials with high electric conductivity for forming a circuit pattern are adhered and fixed to an aluminum base for processing 4 with adhesive 3.

Dimensions of the base for processing 4 are thickness: 20 mm, length: 100 mm, and width: 80 mm, and a double-faced adhesive material (No. 1650: produced by Three Bonds) is used as an adhesive 3 for adhesion between the copper materials 1a as well as 1b and the base for processing 4.

(2) Second Step

Figure 7B:
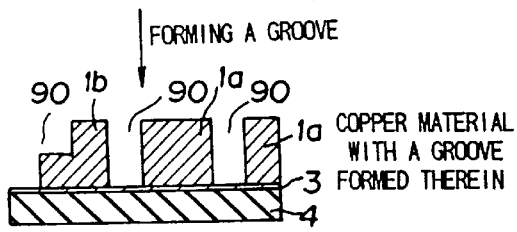

As shown in FIG. 7B, as a second step, the adhered construction in the first step as shown in FIG. 7A is set in a milling machine, and a groove section 90 (depth: 2.0 mm) is formed by an end mill (machining diameter: φ 1.0 mm) to prepare a copper material with a groove formed therein.

(3) Third Step

Figure 7C:
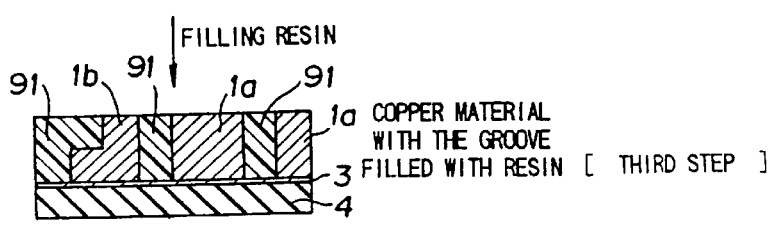

As shown in FIG. 7C, as a third step, epoxy resin 91 (YZ3727/YH3724: produced by Ryoden Kasei), which is in a liquid-phase under the room temperature, is poured into the groove section 90 formed therein, and is heated for curing for 2 hours under the temperature of 140° C.

(4) Fourth Step

Figure 7D:
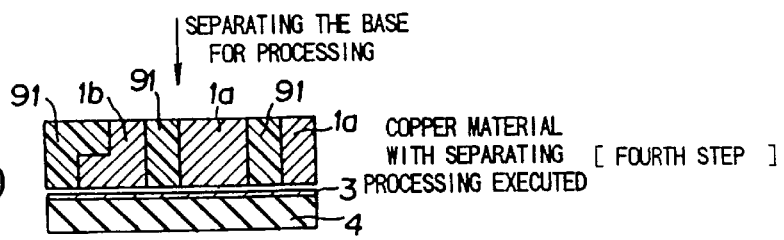
Figure 7E:
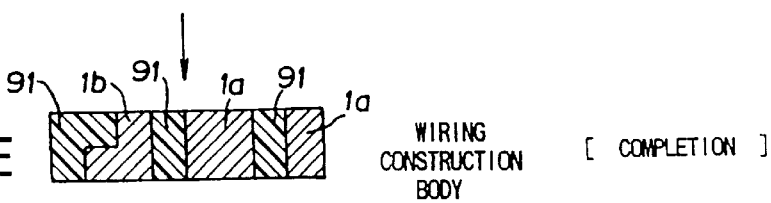

Then as shown in FIG. 7D, as a fourth step, a section of the wiring construction body which is a copper material with a groove filled with resin prepared in the third step as shown in FIG. 7C is separated from the base for processing 4, and the wiring construction body as shown in FIG. 5E can be obtained. It should be noted that, although description of the embodiment assumes use of a copper material as a conductor material, but it is not limited to a copper material, any other material such as brass, a copper alloy, aluminum as well as aluminum alloy, iron as well as iron-based alloy, zinc as well as zinc alloy, silver as well as silver alloy, and gold as well as gold-based alloy can be used within a scope of the claims, and also as the materials 1a and 1b indicated as described above, any material into which any of those materials described above are assembled may be adhered and fixed to a base for processing.

With the present embodiment, a plurality of copper materials 1 being the materials with high electric conductivity are placed on a portion of the wiring construction body required for forming a desired circuit pattern and provided on the base for processing 4, and a groove is formed by milling, so that, as compared to a case where a circuit pattern is formed by providing the materials with high electric conductivity on the entire wiring construction body, a quantity of processing can be reduced by providing the materials with high electric conductivity for each block, which makes it possible to manufacture a wiring construction body more efficiently.

Next, a description is made for Embodiment 7. FIG. 8A to FIG. 8E are views each showing a process flow in other method of manufacturing a wiring construction body. Detailed description is made below with reference to the related drawings.

(1) First Step

As shown in FIG. 8A, as a first step, a copper material 1a (thickness: 0.5 mm, length: 100 mm, width: 80 mm), a copper material 1b (thickness: 0.5 mm, length: 100 mm, width: 80 mm), and a copper material 1c (thickness: 0.5 mm, length: 100 mm, width: 80 mm) each of which is a material with high electric conductivity used for forming a circuit pattern respectively are adhered and fixed to each other with a double-faced adhesive material 36 respectively, and then the copper material 1c is adhered and fixed to a base for processing 4.

(2) Second Step

As shown in FIG. 8B, as a second step, the laminated body A prepared in the first step is set in a milling machine, and groove sections 90 (depth 2.0 mm) are formed in the copper materials 1a to 1c.

(3) Third Step

As shown in FIG. 8C, as a third step, epoxy resin 91 (YZ3727/YH3724: produced by Ryoden Kasei), which is in a liquid phase under the room temperature, is poured into the groove sections 90 in the laminated body A' with the grooves prepared in the second step, and is heated for curing for 2 hours under the temperature of 140° C.

(4) Fourth Step

As shown in FIG. 8D, as a fourth step, the laminated body A" prepared in the third step is separated from each other in each portion adhered by the doubled-faced adhesive material 3b (an adhered layer) of the copper materials 1a, 1b and 1c, and a plurality of wiring construction bodies can be obtained.

With the present embodiment, a plurality of wiring construction bodies can efficiently and easily be obtained by using a laminated body consisting of materials with high electric conductivity, and also as other example, the base for processing and a plurality of materials with high electric conductivity may be simultaneously laminated and adhered to each other in place of laminating and adhering them discretely like that in the present embodiment, in this case, a base for processing 4 and materials with high electric conductivity are simultaneously adhered and fixed to each other with adhesive, so that adhering steps can be saved.

Next, a description is made for Embodiment 8. FIG. 9A to FIG. 9D are views each showing a process flow in other method of manufacturing a wiring construction body. Detailed description is made below with reference to the related drawings.

(1) First Step

Figure 9A:
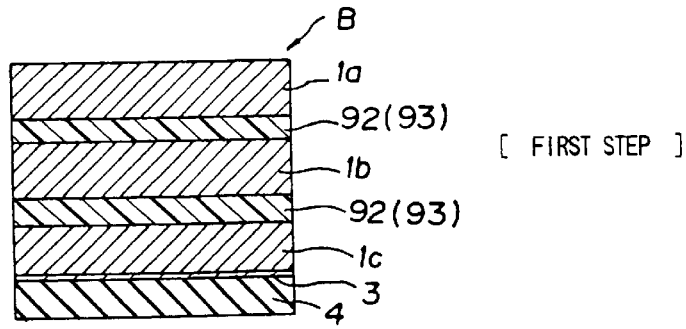
FIGS. 9A to 9D are simulated manufacturing process diagrams showing steps of manufacturing the wiring construction body according to an eighth and ninth embodiment.

As shown in FIG. 9A, as a first step, a copper material 1a (thickness: 0.5 mm, length: 100 mm, width: 80 mm) and a copper material 1b (thickness: 0.5 mm, length: 100 mm, width 80 mm), each of which is a material with high electric conductivity used for forming a circuit pattern are laminated, and a plate material 92 made of polyamide (thickness:1.0 mm, length: 100 mm, width: 80 mm) is inserted therebetween, and furthermore, a plate material 92 made of polyamide (thickness: 1.0 mm, length: 100 mm, width: 80 mm) is inserted between the copper material 1b (thickness: 0.5 mm, length: 100 mm, width: 80 mm) and a copper material 1c (thickness: 0.5 mm, length: 100 mm, width: 80 mm) to be formed into a multilayered form, and each material therein is adhered and fixed to a base for processing 4 with adhesive 3.

(2) Second Step

Figure 9B:
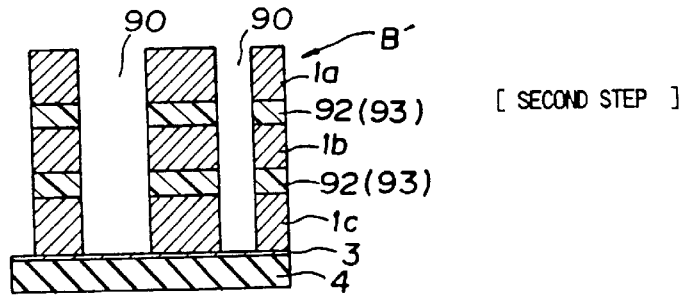

As shown in FIG. 9B, as a second step, the laminated body B prepared in the first step is set in a milling machine, and groove sections 90 (depth: 2.0 mm) are formed in the copper materials 1a to 1c by an end mill (machining diameter: φ 1.0 mm).

(3) Third Step

Figure 9C:
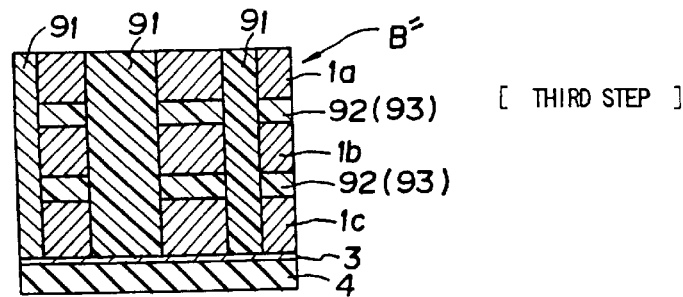

As shown in FIG. 9C, as a third step, epoxy resin 91 (YZ3727/YH3724: produced by Ryoden Kasei), which is a liquid phase under the room temperature, is poured into the groove sections 90 in the laminated body B' prepared in the second step, and is heated for curing for 2 hours under the temperature of 140° C.

(4) Fourth Step

Figure 9D:
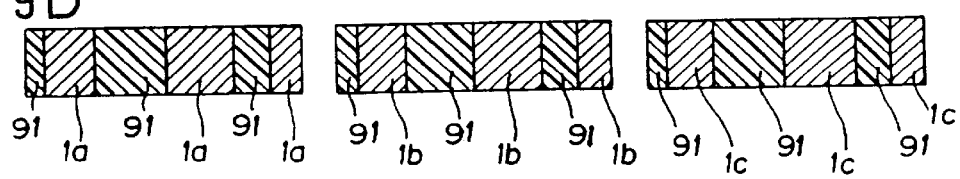

As shown in FIG. 9D, as a fourth step, the laminated body B" prepared in the third step is divided into several pieces by cutting a portion of the plate materials 92 made of polyamide inserted between the copper materials to obtain a plurality of wiring construction bodies.

It should be noted that, although description of the embodiment assumes use of polyamide as a resin material, but it is not limited to polyamide, and any resin material having excellent processability may be used in place thereof.

With the present embodiment, a portion of resin is processed, so that processability thereof is excellent, and materials with high electric conductivity can easily be separated from each other, which makes it possible to improve the workability thereof.

Next, a description is made for Embodiment 9 of the present invention with reference to FIGS. 9A to 9D.

(1) First Step

As shown in FIG. 9A, as a first step, a copper material 1a (thickness: 0.5 mm, length: 100 mm, width: 80 mm), a copper material 1b (thickness: 0.5 mm, Length: 100 mm, width: 80 mm), and a copper material 1c (thickness: 0.5 mm, length: 100 mm, width: 80 mm), each of which is a material with high electric conductivity used for forming a circuit pattern, are laminated to form a multilayered construction, and in the present embodiment, an aluminum plate material 93 (thickness: 1.0 mm, length: 100 mm, width: 80 mm) is inserted between the copper materials 1a, 1b, and 1c, and is adhered to the adjoining copper materials with adhesive.

(2) Second Step

As shown in FIG. 9B, as a second step, the laminated body B prepared in the first step is set in a milling machine, and groove sections 90 are formed with an end mill (machining diameter: 1.0 mm) in the copper materials 1a to 1c.

(3) Third Step

As shown in FIG. 9C, as a third step, epoxy resin 91 (YZ3727/YH3724: Produced by Ryoden Kasei), which is a liquid phase under the room temperature, is poured into the groove section 90 in the laminated body B' prepared in the second step 2, and is heated for curing for 2 hours under the temperature of 140° C.

(4) Fourth Step

As shown in FIG. 9D, as a fourth step, the laminated body B" prepared in the third step is divided into several pieces by cutting the aluminum plate materials 93 inserted between the copper materials to obtain a plurality of wiring construction bodies.

It should be noted that, although description of the embodiment above assumes use of aluminum as a material with good processability, the material is not limited to aluminum, and any material with high processability such as iron, brass, or zinc alloy may be used.

With the present embodiment, wiring construction bodies can easily be separated from each other by processing sections formed into a multilayered construction and having high processability.

Next, a description is made for Embodiment 10. FIG. 10A to FIG. 10D are views each showing a process flow in other method of manufacturing a wiring construction body. Detailed description is made below with reference to the figures.

(1) First Step

As shown in FIG. 10A, as a first step, copper materials 1a, 1b, 1c (thickness: 0.5 mm, length: 100 mm, width: 80 mm), each of which is a material with high electric conductivity used for forming a circuit pattern, are laminated into a multilayered construction, and adhered and fixed together with a base for processing 4 to each other with adhesive.

(2) Second Step

As shown in FIG. 10B, as a second step, the laminated body C prepared in the first step is set in a milling machine, and a groove section 90 (depth: 2.0 mm) is formed with an end mill (machining diameter: 1.0 mm).

(3) Third Step

In this step, as shown in FIG. 10B, the copper material 1a, which is a material with high electric conductivity, on the top surface with a groove formed therein, is separated from the work with a sucking tool or adhesive, and the copper material 1a is placed on another base 4a for processing.

(4) Fourth Step

Then, as shown in FIG. 10B, epoxy resin 91a (YZ3272/YH3724: Produced by Ryoden Kasei), which is in a liquid phase under the room temperature, is poured into the groove section 90 formed on the copper material 1a, which is a material with high electric conductivity, placed on the base 4a for processing, and is heated for curing for 2 hours under the temperature of 140° C., and then the base 4a for processing is separated from the wiring construction body section.

(5) Fifth Step

As shown in FIG. 10C, as a fifth step, the copper 1b remaining, which is a material with high electric conductivity, on the top surface with a groove formed therein, is separated again from the work with a sucking tool or adhesive, and then the copper material 1b is placed on other base 4b for processing. From this step and on, like in the previous step, epoxy resin 91b (YZ3272/YH3724: Produced by Ryoden Kasei), which is in a liquid phase under the room temperature, is poured into the groove section 90 formed in the copper material 1b, which is a material with high electric conductivity, placed on the base 4b for processing, and the resin is heated for curing for 2 hours under the temperature of 140° C. Then the base 4b for processing is separated from the wiring construction body section.

(6) Sixth Step

As shown in FIG. 10D, as a sixth step, epoxy resin 91c (YZ3272/YH3724: Produced by Ryoden Kasei), which is in a liquid phase under the room temperature, is poured into the groove 90 formed in the copper material 1c final remaining, which is a material with high electric conductivity, with a groove having been formed therein, placed on the base 4 for processing, and the resin is heated for curing for 2 hours with the temperature of 140° C., and then the base 4 for processing is separated from the wiring construction body section. By repeating the operations as described above, a plurality of wiring construction bodies can be obtained.

With the present embodiment, grooves are simultaneously formed in copper materials 1a to 1c, each of which is a material with high electric conductivity, formed into a multilayered construction, then the copper material with a groove having been formed therein is taken out layer by layer, and resin is filled in the groove of each copper material taken out as described above, so that separation of wiring construction bodies is quite easy and a plurality of wiring construction bodies can be obtained within a short period of time.

Figure 11:
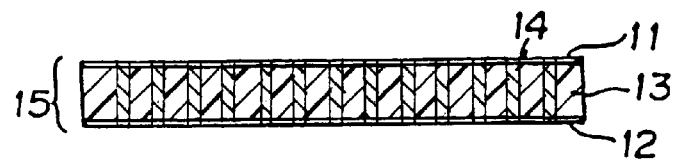
FIG. 11 is an explanatory view showing configuration of the materials with high electric conductivity according to an eleventh embodiment.

Next, a description is made for Embodiment 11 of the present invention. FIG. 11 shows construction of a material with high electric conductivity 15, and in this figure, designated at the reference numerals 11 and 12 are copper materials, at 13 insulating resin, at 14 a through-hole conductor electrically connecting the copper material 11 to the copper material 12.

For instance, through-hole substrates as shown in FIG. 11 (material with high electric conductivity, thickness: 0.5 mm, length: 100 mm, width: 80 mm) are laminated and adhered to a base for processing (not shown herein), and then the base for processing is set in a milling machine, and a groove (depth: 2.0 mm, not shown herein) is formed with an end mill (machining diameter: 1.0 mm). Furthermore, epoxy resin (YZ3272/YH3724: Produced by Ryoden Kasei), which is in a liquid phase under the room temperature, is poured into the groove section formed in the material with high electric conductivity with a groove formed therein, and the resin is heated for curing for 2 hours under the temperature of 140° C. The wiring construction body prepared as described above is cut at a position 1.0 mm away from a processing edge face with a plane perpendicular to a direction of depth of the groove.

With the present embodiment, a compound material comprising insulating resin and a copper material is used to form a through-hole structure, so that a substrate comprising a thick conductor having high resistance against heat cycle can be formed.

Figure 12:
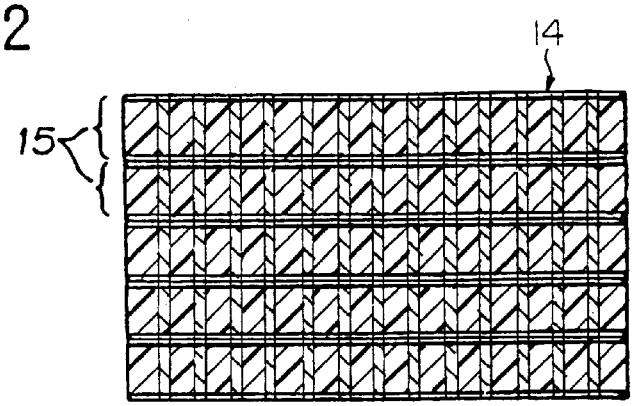
FIG. 12 is an explanatory view showing configuration of the materials with high electric conductivity according to a twelfth embodiment, and showing a state where materials with high electric conductivity of the configuration shown in FIG. 11 are laminated and electrically connected to each other by soldering.

Next, a description is made for Embodiment 12. A laminated work (thickness: 0.5 mm, length: 100 mm, width: 80 mm) comprising a plurality of through-hole substrates (a material with high electric conductivity 15) electrically connected to each other by previously soldering as shown in FIG. 12 is directly set in a milling machine, and a groove section (depth: 2.0 mm) is formed therein with an end mill (machining diameter: φ1.0 mm).

Furthermore, epoxy resin (YZ3727/YH3724: produced by Ryoden Kasei), which is in a liquid phase under the room temperature, is poured into the groove section in the material with high electric conductivity 15 with a groove formed therein, and is heated for curing for 2 hours under the temperature of 140° C. The wiring construction body prepared in the step as described above is cut at a position 1.0 mm apart from the processing edge face with a surface perpendicular to a direction of depth of the groove section.

With the present embodiment, a complex body of the insulating resin and the copper material is used to make a through-hole structure, so that a conductor can be made thicker, and a large current can be applied thereto, and at the same time a substrate consisting of a thick conductor having high resistance against a heat cycle can be formed.

Figure 13:
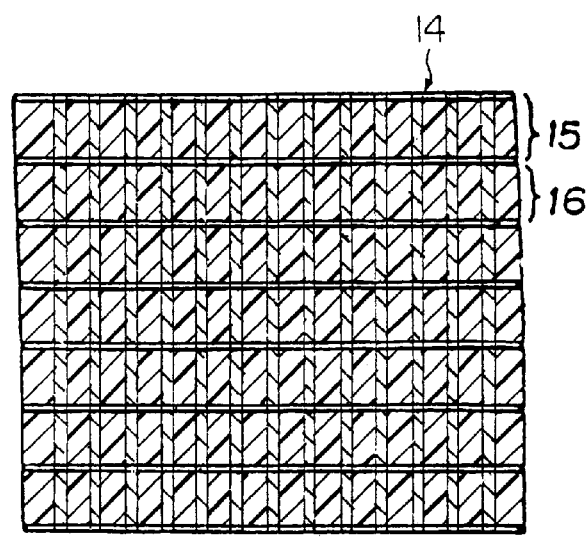
FIG. 13 is an explanatory view showing the material with high electric conductivity according to a thirteenth embodiment and configuration in which the materials with high electric conductivity are laminated.

Next, a description is made for Embodiment 13. Through-hole substrates (a material with high electric conductivity 15: thickness: 0.5 mm, length: 100 mm, width: 80 mm) and copper materials (a material with high electric conductivity 16: thickness: 0.5 mm, length: 100 mm, width: 80 mm) previously and electrically connected to each other as shown in FIG. 13 are alternately laminated, and are set in a milling machine, and then a groove section (depth 2.0 mm) is formed with an end mill (machining diameter: 1.0 mm). Furthermore, epoxy resin (YZ3727/YH3724: produced by Ryoden Kasei), which is in a liquid phase under the room temperature, is poured into the formed groove section, and is heated for curing for 2 hours under the temperature of 140° C. The wiring construction body prepared in the step as described above is cut at a position 1.0 mm away from the processing edge face with a surface perpendicular to a direction of depth of the groove.

With the present embodiment, a wiring construction body in which the through-hole substrates 15 and copper materials 16 are alternately laminated is used, so that a conductor can be made thicker, and a large current can be applied thereto, and at the same time a substrate consisting of thick conductors having high resistance against a heat cycle can be formed.

Figure 14:
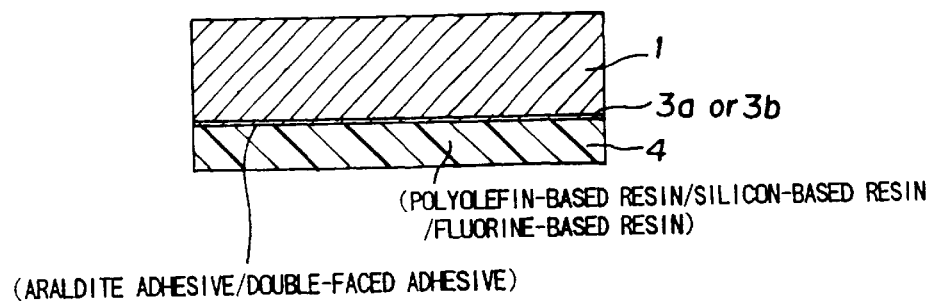
FIG. 14 is a simulated explanatory view of configuration in which the material with high electric conductivity is fixed to the base for processing in a case where the wiring construction body according to a fourteenth embodiment is manufactured.

Next, a description is made for Embodiment 14. FIG. 14 is an explanatory view showing a material with high electric conductivity (a copper material 1) used for forming a circuit pattern and a base for processing 4 for instance, in a case where a wiring construction body equivalent to that in the first step as shown in FIG. 6A is manufactured.

In the present embodiment, resin having a small adhesion to adhesive 3 is employed as a material for a base for processing 4, and as shown in FIG. 14, a copper material 1 (thickness: 0.5 mm, length: 100 mm, width: 80 mm) which is a material with high electric conductivity used for forming a circuit pattern is adhered and fixed to the base for processing is by using adhesive 3.

Dimensions of the base for processing 4 are thickness: 20 mm, length: 100 mm, and width: 80 mm, and as adhesive, for instance, an Araldite adhesive 3a (produced by Nagase Ciba) or a double-faced adhesive material 3b (No. 1650: produced by Three Bond) is used.

The wiring construction body comprising the copper material 1 adhered and fixed to the base for processing 4 made of the material described above via adhesive 3 is set in the milling machine, and a groove section 90 (depth: 0.7 mm) is formed in the section of copper material 1 as shown in FIG. 6A to FIG. 6E with an end mill (machining diameter: φ1.0 mm), and furthermore, epoxy resin 91 (YZ3727/YH3724: produced by Ryoden Kasei), which is in a liquid phase under the room temperature, is poured into the groove section 90 formed therein, and is heated for curing for 2 hours under 140° C.

With the present embodiment, as a material for the base for processing 4, resin having low adhesion to the adhesive 3 is used, so that, for instance, in the embodiment described above, separation (refer to the fourth step as shown in FIG. 6D and the fourth step as shown in FIG. 7D) between the base for processing 4 and the section of wiring construction body can easily be executed, which makes it possible to remarkably improve the workability thereof.

Next, a description is made for Embodiment 15. As resin having small adhesion to the adhesive, polyolefin-based resin such as polypropylene, polyethylene, or vinyl chloride, silicon-based resin or fluorine-based resin is employed.

With the present embodiment, like in a case of Embodiment 14 as described above, separation between a base for processing and a section of wiring construction body can easily be executed, which makes it possible to improve the workability thereof.

Next, a description is made for Embodiment 16. As shown in FIG. 6A to FIG. 6E, a copper material 1 (thickness: 0.5 mm, length: 100 mm, width: 80 mm) which is a material with high electric conductivity used for forming a circuit pattern is adhered and fixed to an aluminum base for processing 4 with adhesive 3.

Dimensions of the base for processing 4 are thickness: 20 mm, length: 100 mm, and width: 80 mm, and a double-faced adhesive material (No. 1650: produced by Three Bonds) is used as adhesive 3. The construction body (Refer to the first step in FIG. 4) is set in a milling machine, and a groove section 90 (depth: 0.7 mm) as shown in the second step in FIG. 4 is formed with an end mill (machining diameter: 1.0 mm). Furthermore, a mold-releasing agent (a silicon-based mold-releasing agent) is applied to the groove section 90 (a portion filled with resin) formed in the construction to reduce adhesive force between the base for processing 4 and the epoxy resin, and then epoxy resin 91 (YZ3727/YH3724: produced by Ryoden Kasei), which is in a liquid phase under the room temperature, is poured into the groove section 90, and is heated for curing for 2 hours under 140° C.

It should be noted that, although description of the embodiment above assumes use of a silicon-based mold-releasing agent, the mold-releasing agent is not limited to a silicon-based one, and any material with such properties that adhesive force between a base for processing 4 and epoxy resin 91 can be reduced may be used.

With the present embodiment, the adhesive force between the material for base for processing 4 and epoxy resin 91 can further be made smaller with a mold-releasing agent applied to the groove section 90 described above, so that a section of a wiring construction body can extremely easily be separated from the base for processing 4.

Figure 15:
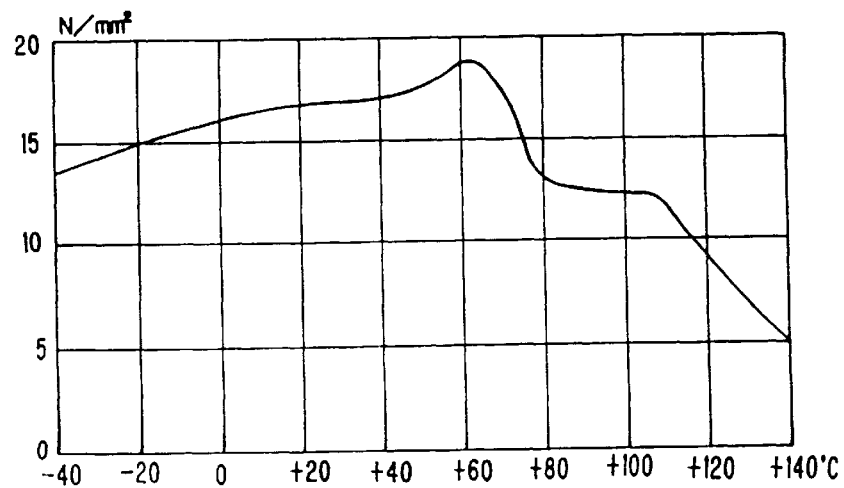
FIG. 15 is a graph showing temperature characteristics of adhesive force according to adhesive.

Next, a description is made for Embodiment 17. As shown in the first step in FIG. 6A, a copper material 1 (thickness: 0.5 mm, length: 100 mm, width: 80 mm) which is a material with high electric conductivity used for forming a circuit pattern is adhered and fixed to an aluminum base for processing 4 with adhesive 3. Dimensions of the base for processing 4 are thickness: 20 mm, length: 100 mm, and width: 80 mm, and an Araldite adhesive (AV138/HV998: produced by Nihon Ciba Geigy) is used as adhesive 3. This Araldite adhesive is, as shown in FIG. 15, an adhesive having such properties that adhesive force is approx. 15 N/mm$^2$ under the room temperature, which is large, but adhesive force becomes lower to approx. 5 N/mm$^2$ when heated to around 140° C.

The construction prepared via the first step as described above is set in a milling machine, and a groove section 90 (depth: 0.7 mm) is formed with an end mill (machining diameter: φ1.0 mm). Furthermore, epoxy resin 91 (YZ3727/YH3724: produced by Ryoden Kasei), which is in a liquid phase under the room temperature, is poured into the groove section 90 (a portion filled with resin) formed therein, and is heated for curing for 2 hours under the temperature of 140° C. Then the adhesive force of the adhesive 3 described above is reduced by being heated to around 150° C.

It should be noted that, although description of the embodiment assumes use of an Araldite adhesive which is one of epoxy-based ones as adhesive, but it is not limited to the epoxy-based adhesive, and any type of adhesive having such properties that adhesive force remarkably reduces such as acrylic-based adhesive or hot-melt-based adhesive may be used.

With the present embodiment, Araldite adhesive which is one of epoxy-based ones is used as adhesive 3 to adhere the base for processing 4 to the copper material 1, so that adhesive force of the adhesive 3 can be lowered by being heated to around 150° C., and, for instance, in the fourth step in FIG. 6D, a section of the wiring construction body can extremely easily be separated from the base for processing 4.

Next, a description is made for Embodiment 18. As shown in the first step in FIG. 6A, a copper material 1 (thickness: 0.5 mm, length: 100 mm, width: 80 mm) which is a material with high electric conductivity for forming a circuit pattern is fixed to a base for processing 4 made of aluminum (A5052: thickness: 20 mm, length: 100 mm, width: 80 mm) with adhesive 3. Herein silicon-based adhesive (KE1204: produced by Shin'etsu Silicon) is used as adhesive 3. The construction body (Refer to the first step in FIG. 6A) is set in a milling machine, and a groove section 90 (depth: 0.7 mm) as shown in the second step in FIG. 6B is formed in the copper material 1 with an end mill (machining diameter: φ1.0 mm).

Furthermore, epoxy (potting) resin 91 (YZ3727/YH3724: produced by Ryoden Kasei), which is in a liquid phase under the room temperature, is poured into the portion with a groove formed as shown in the third step in FIG. 6C, namely into the groove section 90, and is heated for curing for 2 hours under the temperature of 140° C. Epoxy resin 91 in a liquid phase has a low adhesion, so that circuit pattern conductors are fixed and integrated to each other by easily filling the resin into the groove section 90 and by heating it for curing. Then as shown in the fourth step in FIG. 6D, a wiring construction body can easily be obtained by separating sections of wiring construction bodies from the base for processing 4.

With the present embodiment, silicon-based adhesive is used, so that adhesive force to epoxy resin is extremely low, and separation between the base for processing 4 and sections of wiring construction bodies can further easily be executed in the fourth step in FIG. 6D.

Next, a description is made for Embodiment 19 of the present invention. As shown in relation to a first step shown in FIG. 6A, a copper material 1 (thickness: 0.5 mm, length: 100 mm, width: 80 mm), which is a material with high electric conductivity used for forming a circuit pattern, is fixed with adhesive to a base for processing 4 made from an aluminum plate (A5052, thickness: 20 mm, length: 100 mm, width: 80 mm). Herein as adhesive 3, foaming adhesive (3195: Produced by Nitto Denko) is used.

The construction body prepared in the first step described above is set in a milling machine, and a groove section 90 (depth: 0.7 mm) as shown in the second step in FIG. 6B is formed with an end mill (machining diameter: 1.0 mm). Furthermore, epoxy (potting) resin (YZ3727/YH3724: Produced by Ryoden Kasei), which is in a liquid phase under the room temperature, is poured into the groove prepared in the third step in FIG. 6C (groove section 90), and the resin is heated for curing for 2 hours under the temperature of 140° C. The liquid epoxy resin has low adhesion, and can easily be filled in the groove section 90, and the circuit pattern conductor (copper material 1) can be fixed and integrated by heating the resin for curing. Furthermore by heating the resin in the fourth step shown in FIG. 6D, an adhesive force of the foaming adhesive can be reduced.

It should be noted that, although description of the present embodiment above assumes a case where the product 3195 produced by Nitto Denko is used as a foaming adhesive, the foaming adhesive is not limited to this product, any foaming adhesive may be used on the condition that a foaming agent is mixed in the adhesive. The foaming agent available for this purpose includes a derivative of diazoamino, azonitril (such as AIBN), a derivative of asodicarbonic acid (such as Azodicarboxylic acid amido), dinitropentamethylene tetramine, and benzene monohydrazol.

With the present embodiment, foaming adhesive is used as the adhesive 3, so that the wiring construction body section can easily be separated from the base for processing 4 by heating the adhesive.

Figure 16:
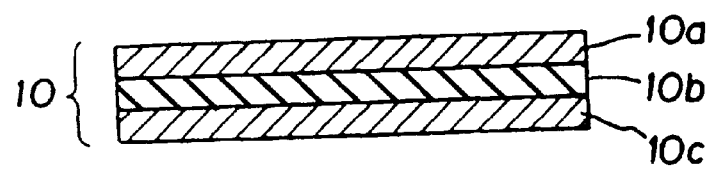
FIG. 16 is an explanatory view showing configuration of the materials with high electric conductivity according to a twentieth embodiment.
Figure 17:
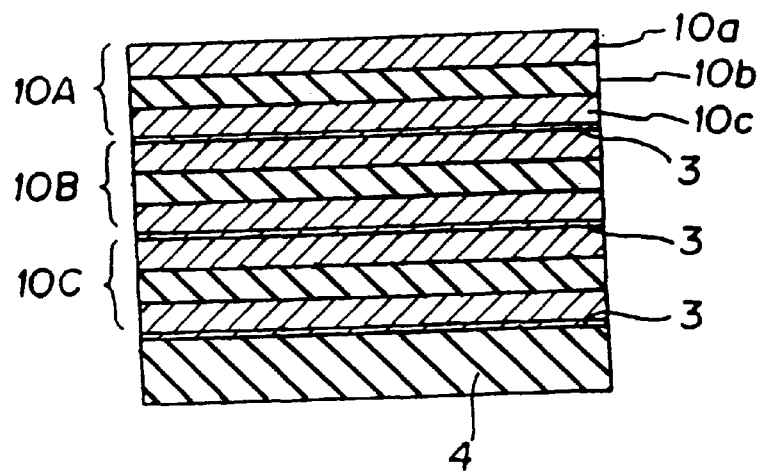
FIG. 17 is an explanatory view according to the twentieth embodiment equivalent to the first step shown in FIG. 10 in which the materials with high electric conductivity shown in FIG. 11 is used.

Next, a description is made for Embodiment 20 of the present invention. FIG. 16 shows structure of a material with high electric conductivity, and in this figure, a material 10 with high electric conductivity is a clad material comprising three layers of copper materials 10a, 10c and an iron material 10b. FIG. 17 is a diagram corresponding to a first step (Refer to the manufacturing method 7) in FIG. 10A, in which the material 10 with high electric conductivity shown in FIG. 16 is used, and shows a laminated construction body comprising the material 10 with high electric conductivity and a base for processing 4 used in the clad structure.

The three-layered clad material (with high electric conductivity) comprising a conductive copper material 10a (thickness: 0.5 mm, length: 100 mm, width: 80 mm), copper material 10c (thickness: 0.5 mm, length: 100 mm, width: 80 mm), and a conductive iron material 10b (thickness: 0.5 mm, length: 100 mm, width: 80 mm) is set in a milling machine, and a groove section (depth: 2.0 mm) is formed with an end mill (machining diameter: 1.0 mm).

In this step, by using an attracting tool making use of magnetism, the material with high electric conductivity 10A on the top surface with a groove having been formed thereon is separated from the work, the material with high electric conductivity 10 A with a groove having been formed therein is placed on a base for processing, and furthermore epoxy resin (YZ3272/YH3724: Produced by Ryoden Kasei), which is in a liquid phase under the room temperature, is poured into the groove section of the material with high electric conductivity 10A with the groove having been formed therein, and the resin is heated for curing for 2 hours under the temperature of 140° C. Then again by using an attracting tool making use of magnetism, the material with high electric conductivity 10B, which is a remaining material with a groove having been formed therein, on the top surface is separated from the work, and the material with high electric conductivity 10B with the groove having been formed therein is placed on another base for processing. In the subsequent step, like in the previous step, the epoxy resin, which is in a liquid phase under the room temperature, is poured into a groove section of the material with high electric conductivity 10B with the grove having been formed therein, and the resin is heated for curing for 2 hours under the room temperature of 140° C., and thus by repeating the operations described above, a plurality of wiring construction bodies can be obtained (For details of the manufacturing method, refer to FIG. 10A to FIG. 10D).

It should be noted that, although description of the present embodiment above assumes a case of three-layered clad material, the construction is not necessarily limited to a three-layered one, one-layered construction comprising a magnetic body, two-layered one including a magnetic body, or further multi-layered construction body is allowable. Also it should be noted that, although the above description assumes a case of a construction comprising layers of a copper material, an iron material, and a copper material in this order, the construction is not necessarily limited to this one, and for instance a construction comprising three layers of an iron material, a copper material, and an iron material in this order is allowable.

With the present embodiment, because an iron material is inserted between copper materials, materials with high electric conductivity can be separated from each other by making use of magnetism, and as a result, a process for separating the materials with high electric conductivity is quite easy. Also because a three-layered clad material is used as a material with high electric conductivity, the material quality can be selected according to the necessity, and various types of characteristics can be added to a wiring construction body. For instance, in the present embodiment, as an apparent linear expansion coefficient in the material with high electric conductivity can be reduced by building a clad material with an iron material and copper materials, it is possible to form a thick conductor substrate having high resistance against heat cycle, and in a case of combination of an aluminum material and an iron material, it is possible to directly bond an aluminum wire, so that packaging of chip or the like is possible in case of a molybdenum plate. parts such as a terminal base)

Next, a description is made for Embodiment 21 of the present invention. In the method of manufacturing a wiring construction body according to the present invention, at first, a copper material 22 (thickness: 0.1 mm, length: 60 mm, width: 20 mm), which is a material with high electric conductivity used for forming a circuit pattern, a terminal base 20, and nuts 21a, 21b for fixing are adhered and fixed to a base for processing made from an aluminum plate with a double-faced adhesive material. Dimensions of the base for processing are thickness: 20 mm, length: 100 mm, and width: 80 mm, and a double-faced adhesive material (No. 1650: Produced by Three Bond) is used for adhesion.

The processed material prepared in the above step is set in a milling machine, and a groove section (depth: 2.0 mm) is formed therein with an end mill (machining diameter: 1.0 mm). Furthermore epoxy resin 99 (YZ3272/YZ3724: Produced by Ryoden Kasei), which is in a liquid phase under the room temperature, is poured into the groove section formed as described above. In the step in which the epoxy resin 99 is poured into, required parts (such as the terminal base 20, nuts 21a, 21b for fixing) have been provided therein, and the epoxy resin is heated for curing for 2 hours under the temperature of 140° C., and then a section of the wiring construction body in the processed material is removed from the base for processing to obtain a wiring construction body.

Figure 18A:
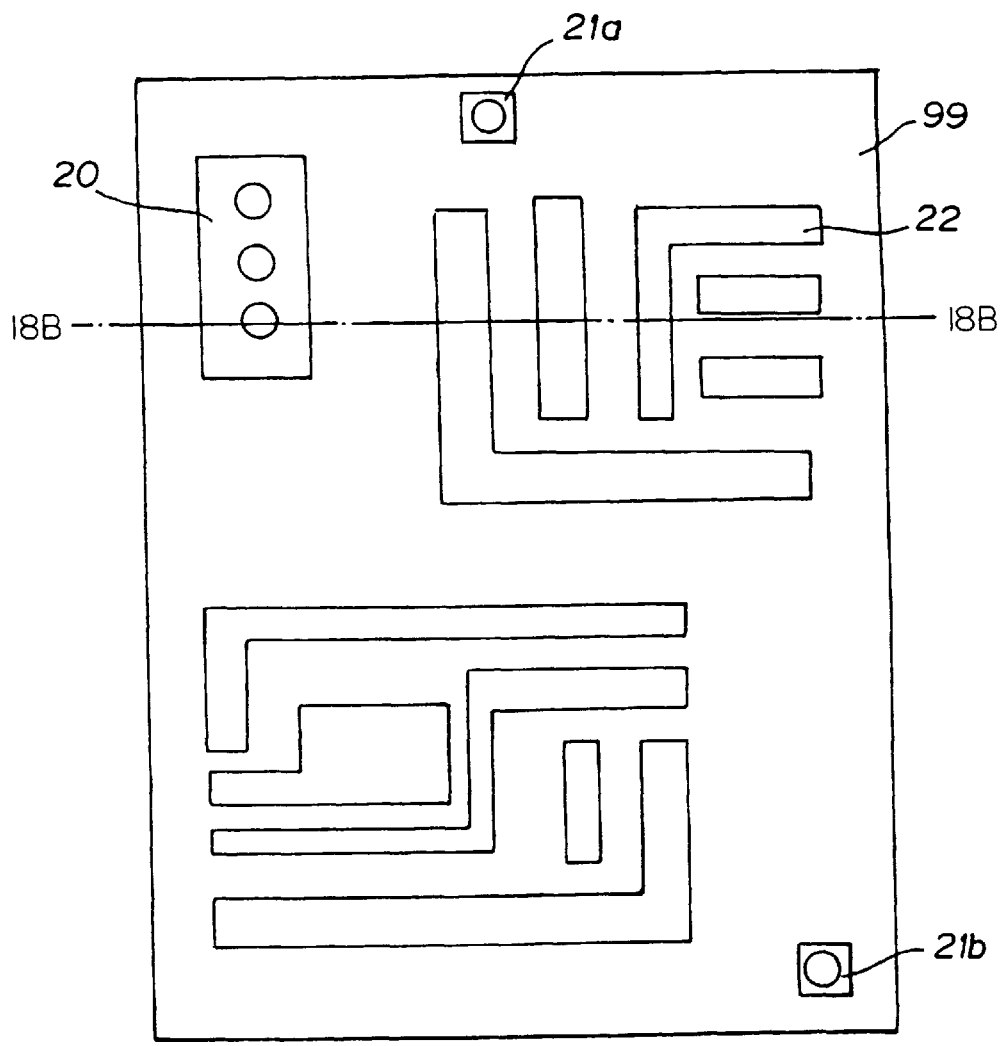
FIG. 18A is an explanatory view showing an example of the wiring construction body according to a twenty-first embodiment.
Figure 18B:
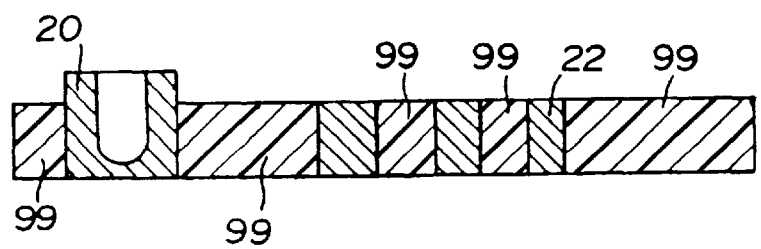
FIG. 18B is a cross-sectional view showing the wiring construction body shown in FIG. 18A which is cut along the line A—A'.

FIG. 18A shows an example of the wiring construction body obtained according to the manufacturing method described above. FIG. 18B is a cross-sectional view of the wiring construction body taken along a line 18B—18B in FIG. 18A. In the present embodiment, parts required for forming a circuit pattern such as, for instance, the terminal base 20 and nuts 21a, 21b for fixing can simultaneously be integrated and fixed, so that a wiring construction body can be formed efficiently, and at the same time, as the terminal base 20, nuts 21a, 21b for fixing are fixed with resin poured into an area around the parts, and for this reason a subsequent step for fixing the parts can be omitted, which in turn results in improvement of workability.

Next, a description is made for Embodiment 22 of the present invention. In Embodiment 22, a copper material (thickness: 20 mm, length: 100 mm, width: 80 mm), which is a material with high electric conductivity, is set in a milling machine, and a groove section (thickness: 2.0 mm) is formed, for instance, with an end mill having a machining diameter of 2.5 mm.

In this embodiment, assuming that a wiring construction body is used, for instance, in a 200-volt system inverter control unit, an insulating range for a conductor is set to 2.5 mm, and an end mill having a machining diameter of 2.5 mm is used. Then epoxy resin (YZ3272/YZ3724: Produced by Ryoden Kasei), which is in a liquid phase under the room temperature, is poured into the groove section formed in the above processing step, the resin is heated for curing for 2 hours under the temperature of 140° C., and a wiring construction body is prepared by cutting the processed material in a plane perpendicular to a direction of depth of the groove section at a position 1.00 mm away from the edge face for processing.

With the present embodiment, as processing for forming a groove is executed with a machining tool having a machining diameter equal to the insulating range, so that the processing for forming a groove can efficiently be executed with less power. Furthermore if a voltage loaded to a wiring construction body is low, the insulating range is small; for instance, 1.0 mm or 0.5 mm, but by using a machining tool having a machining diameter equal to a required insulating range, the step for forming a groove can be executed more efficiently.

Figure 19:
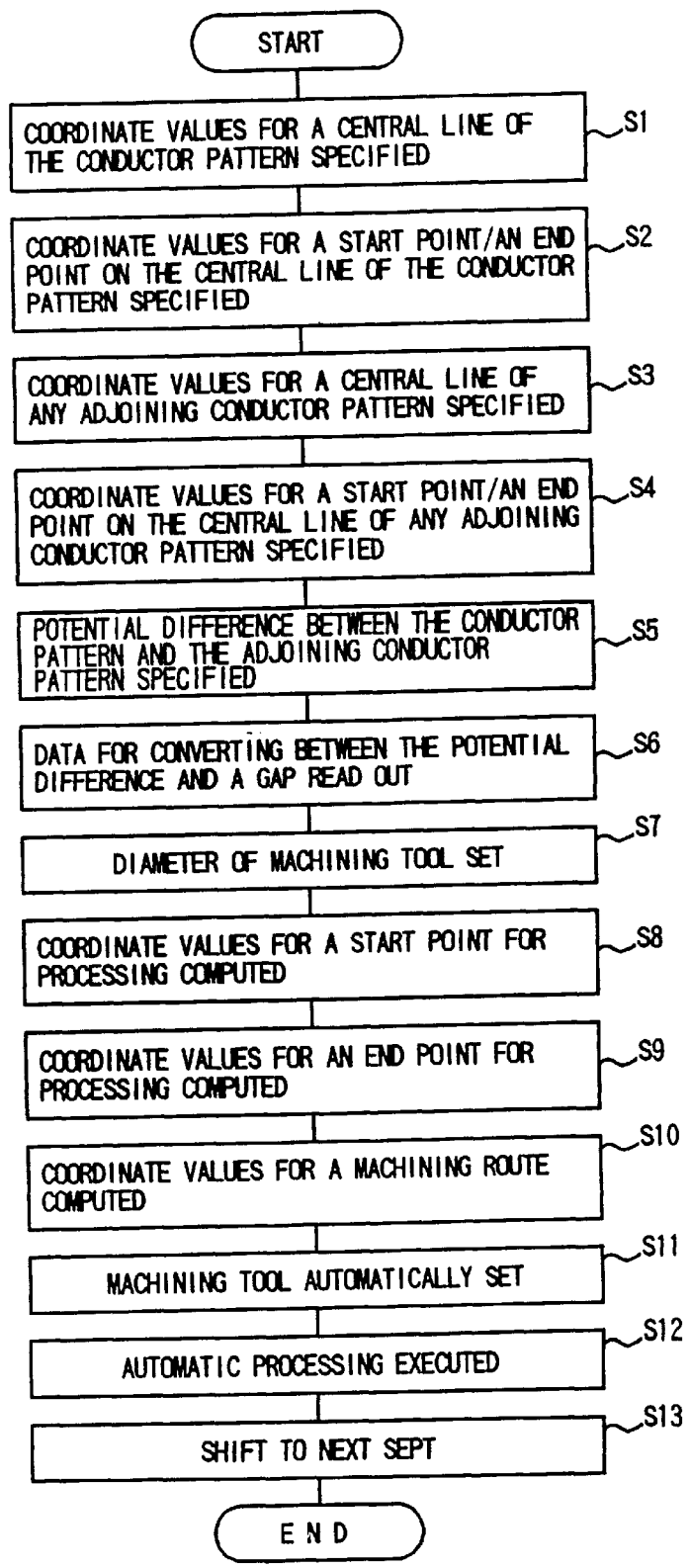
FIG. 19 is a flow chart showing the procedure for setting a processing tool and a processing route in a case where the wiring construction body according to a twenty third embodiment is manufactured.

Next, a description is made for Embodiment 23 of the present invention. FIG. 19 is a flow chart showing operations for setting a machining tool and a machining route in a case of manufacturing the wiring construction body shown in each embodiment described above.

At first, a copper material (thickness: 20 mm, length: 100 mm, width: 80 mm), which is a material with high electric conductivity, is set in a milling machine. Then coordinate values for a central line of a conductor pattern formed in the material with high electric conductivity (S1), and coordinate values for a start point as well as coordinate values for an end point on the central line are specified (S2), and the specified values are inputted into a control section of a milling machine. Then coordinate values for a central line of any adjoining conductor pattern (S3), and coordinate values for a start point as well as coordinate values for an end point on the central line are specified (S4).

Then a potential difference between the conductor pattern and the adjoining conductor pattern is specified (S5), data for converting between the potential difference and a gap is read out (S6), and a diameter of a machining tool corresponding to the potential difference is set (S7). Then, computing of coordinate values for a start point for processing (S8), computing of coordinate values for an end point for processing (S9) as well as computing of coordinate values for a machining route (S10) are executed. Furthermore, a machining tool is automatically set (S11), and automatic processing from coordinate values for a start point for processing to coordinate values for an end point is executed (S12). After the automatic processing has been completed, system control shifts to next step again (S13), and by repeating the same process all of the conductor (circuit) patterns are finally formed. It should be noted that, in a case where system control shifts to the next step, a machining route which has been processed is not regarded as an object to be selected, so that another conductor (circuit) pattern is naturally selected.

With the present embodiment, a diameter of a machining tool and a machining route are automatically set, and processing is executed, so that in the wiring construction body according to each embodiment described above, a desired circuit pattern can efficiently be obtained.

Figure 20:
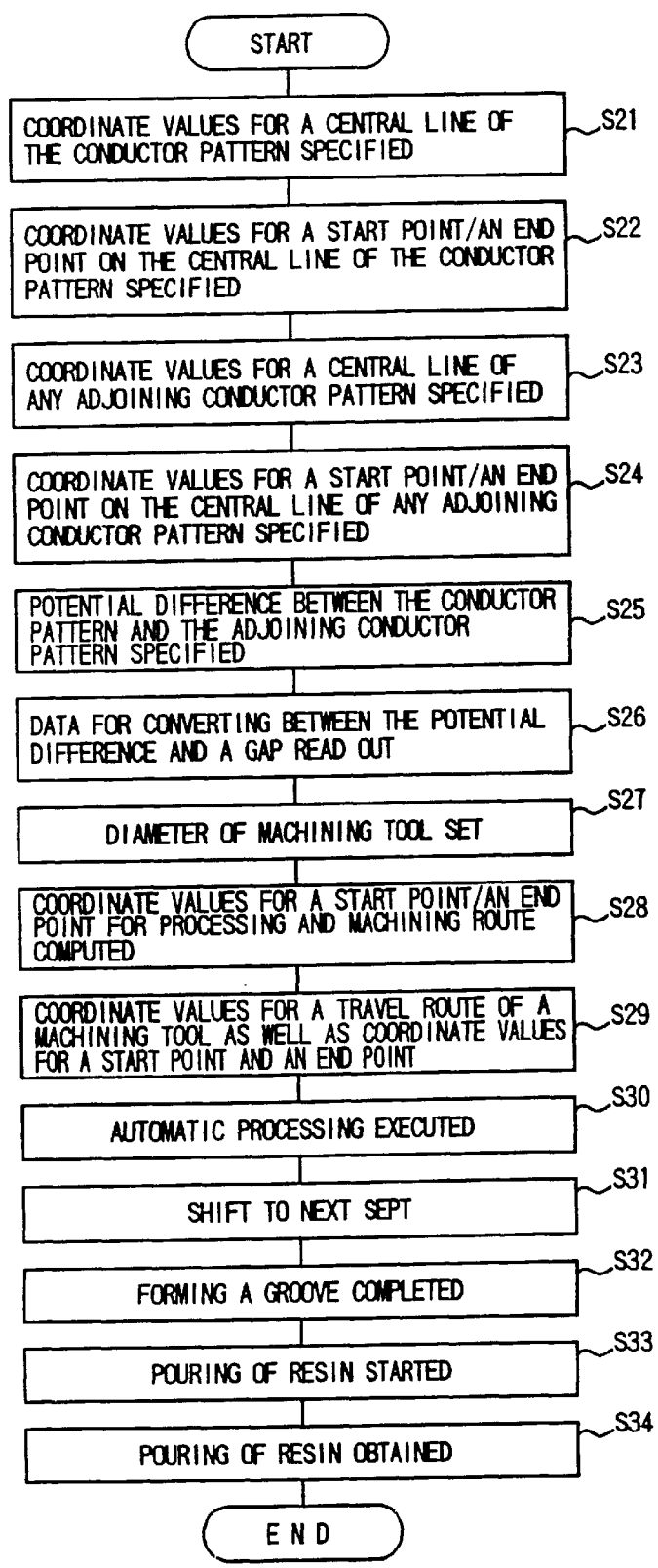
FIG. 20 is a flow chart showing the procedure for setting is a resin pouring route in a case where the wiring construction body according to a twenty-fourth embodiment is manufactured.

Next, a description is made for Embodiment 24 of the present invention. FIG. 20 is a flow chart showing operations for setting a resin pouring route in a case of manufacturing the wiring construction body shown in each embodiment described above. It should be noted that operations from step S21 to step S28 are the same as those from step S1 to step S10 shown in FIG. 19, so that description thereof is omitted herein. After the operation in step S28, coordinate values for a travel route of a machining tool as well as coordinate values for a start point and coordinate values for an end point are computed (S29), and automatic processing is executed (S30). Then system control shifts to the next processing step (S31), and forming a groove is completed (S32). Then pouring of resin is started (S33), the pouring of resin is completed (S34), and a series of operations as described above is finished.

With the present embodiment, by storing coordinate values for a start point when a machining tool is traveled, coordinate values for an end point, and coordinate values for a route halfway through the travel, travel of a pouring nozzle of a dispenser are controlled according to the data described above, so that inputting coordinate values for a position for pouring of the pointing section of the dispenser for pouring resin is omitted, which in turn results in efficiency of the operation for pouring resin.

Figure 21:
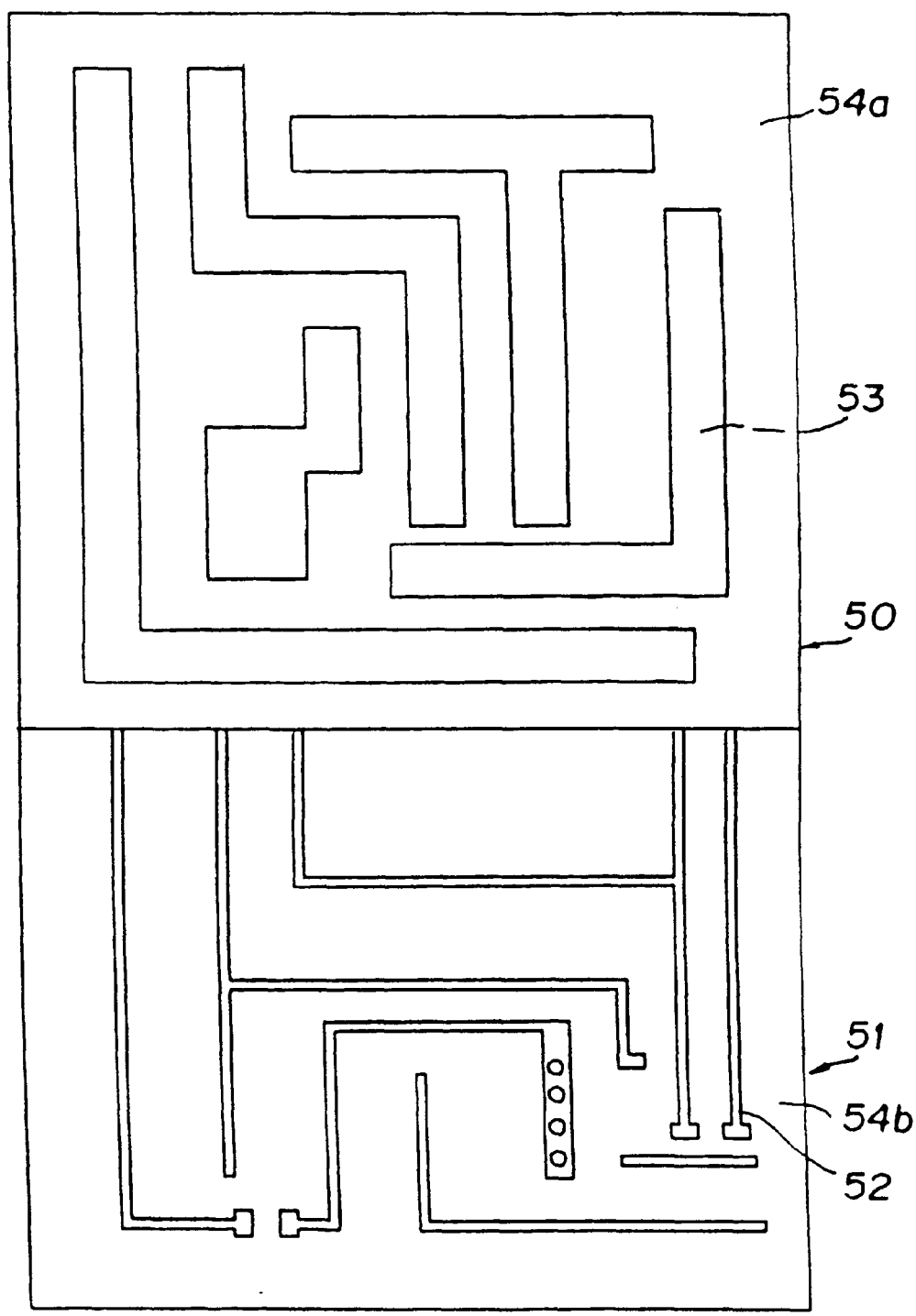
FIG. 21 is an explanatory view showing an example of a circuit board construction electrically connected to the circuit board after the wiring construction body according to a twenty-fifth embodiment has been prepared.

Next, a description is made for Embodiment 25 of the present invention. FIG. 21 is an explanatory view showing an example that a wiring construction body 50 is electrically connected to a circuit board 51 after the wiring construction body 50 is prepared according to the manufacturing method shown in each embodiment described above. The wiring construction body 50 and the circuit board 51 are mechanically fixed and electrically connected to each other. Mechanically fixing a wiring construction body 50 to a circuit board 51 may be executed by screwing, adhering, and soldering or the like. Also electrically connecting a wiring construction body 50 to a circuit board 51 may be executed by soldering or adhering with a conductive adhesive material. It should be noted that, in the figure, designated at the reference numeral 54a is a section filled with resin, at 54b an insulator.

With the present embodiment, a thin conductor is used for a weak current section such as a control section, and a fine conductor pattern 52 is formed as a circuit board 51 by etching, so that dimensional precision in forming a pattern is improved, and a large current section applies a wiring construction body 50 formed by improving precision of the thick material with high electric conductivity described above, and a high-precision circuit board can be formed for both of a fine pattern (conductor pattern 52) and a large current pattern (conductor pattern 53) by electrically connecting the two to each other.

Figure 22:
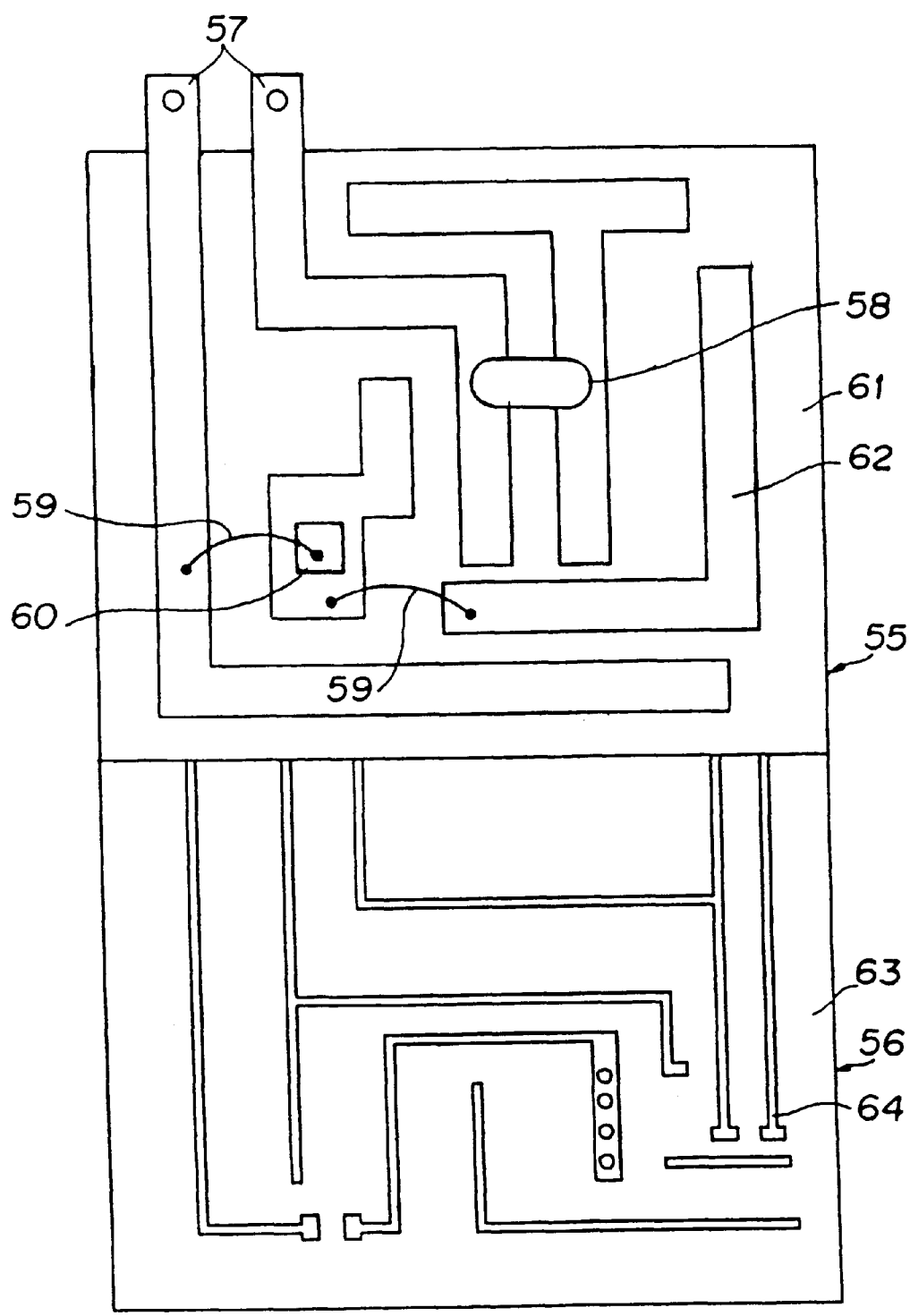
FIG. 22 is an explanatory view showing an example of a circuit board construction electrically connected to the circuit board after the wiring construction body according to a twenty-sixth embodiment has been prepared.

Next, a description is made for Embodiment 26 of the present invention. FIG. 22 is an explanatory view showing an example that a wiring construction body 55 is electrically connected to a circuit board 56 after the wiring construction body 55 is prepared with the manufacturing method shown in each embodiment described above. In the figure, the reference numeral 57 indicates a protruding portion of a conductor pattern which is a material with high electric conductivity. In the present embodiment, in a case where the circuit board 56 and the wiring construction body 55 are electrically connected to each other, the circuit board 56 is made apart from the wiring construction body 55 at their positions and mechanically fixed to each other. The portion 57 protruding from the wiring construction body 55 is used as a terminal, and a lead is connected thereto, or a terminal base is connected thereto. It should be noted that, in the figure, designated at the reference numeral 58 is a resistor, at 59 a wire for connecting a conductor pattern and a bare chip, at 61 a section filled with resin, at 62 a conductor pattern, at 63 an insulator, and at 64 a conductor pattern.
(Effects provided by Embodiment 26)

With the present embodiment, a protruding portion 57 at the portion of the conductor pattern in the wiring construction body 55 is provided, and is used as a terminal, so that a range where the wiring construction body 55 and the circuit board 56 can be applied is extended, and also a number of required parts thereof can be reduced.

Figure 23:
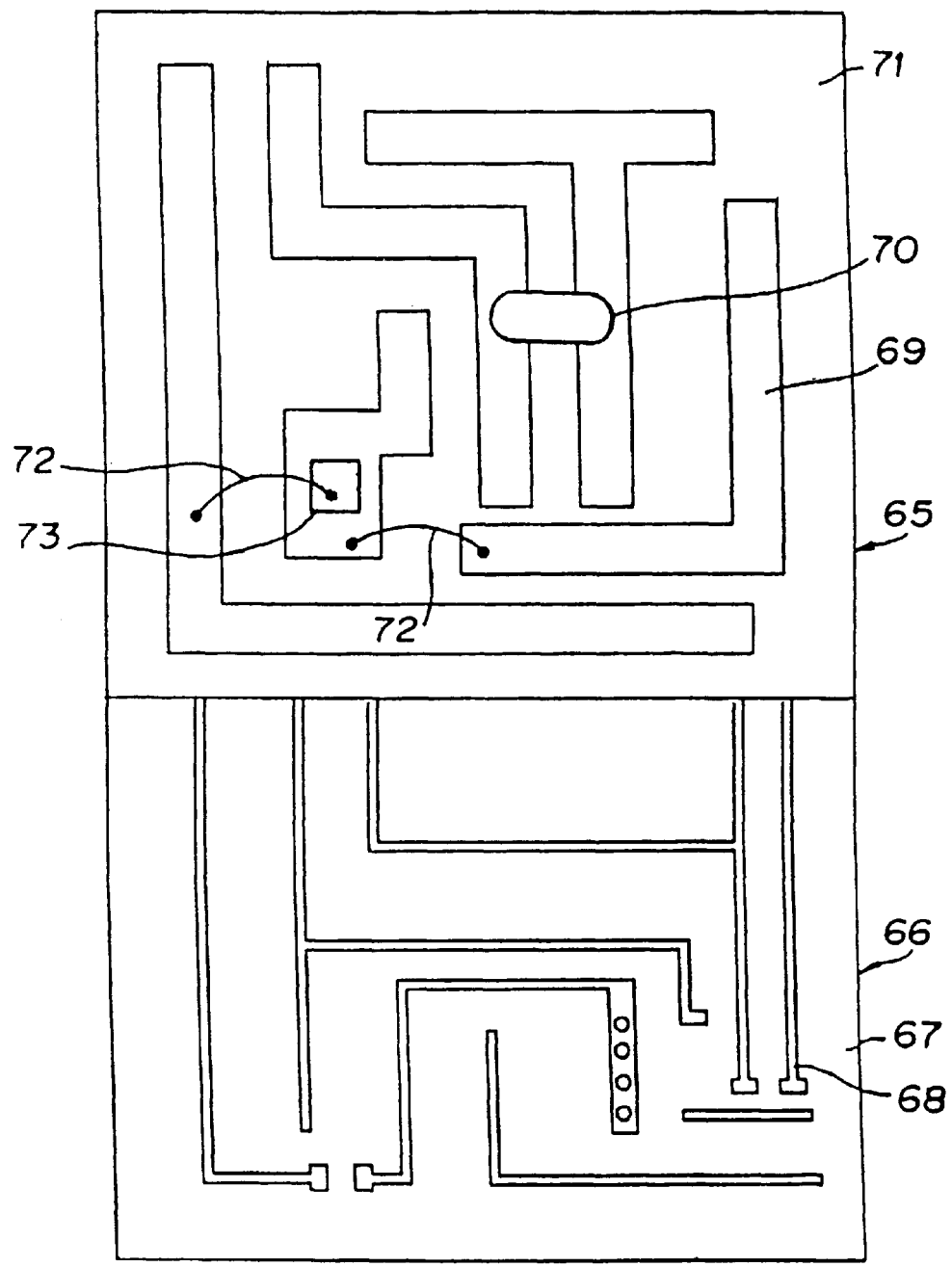
FIG. 23 is an explanatory view showing an example where parts are directly and electrically connected to the thick material with high electric conductivity in the wiring construction body according to a twenty-seventh embodiment.

Next, a description is made for Embodiment 27 of the present invention. FIG. 23 is an explanatory view showing an example that heat-emitting parts are directly and electrically connected to a thick material with high electric conductivity constituting a wiring construction body 65, and in the figure, the reference numeral 73 indicates a bare chip as a heat-emitting part. The material with high electric conductivity has normally a large quantity of thermal conductivity, so that, even if heat-emitting parts are directly connected thereto, heat can quickly and widely be delivered via the conductor, and the radiating capability thereof can be insured.

Namely, the bare chip 73 is placed on the conductor pattern 69 which is a material with high electric conductivity by means of soldering, and also a circuit board 66 to be electrically connected to the conductor pattern 69 of the wiring construction body 65 is previously prepared, and then the circuit board 66 and the wiring construction body 65 are electrically connected to each other with a reflow soldering process. In a large current section, a current can be applied thereto by using the wiring construction body 65. It should be noted that, designated at the reference numeral 67 is an insulator, at 68 a conductor pattern, at 70 a resistor, at 71 a section filled with resin, and at 72 a wire for wiring.

With the present embodiment, a heat spreader in a packaging portion of a bare chip 73 in the large current section is not required, which makes it possible to reduce a number of parts thereof.

Figure 24A:
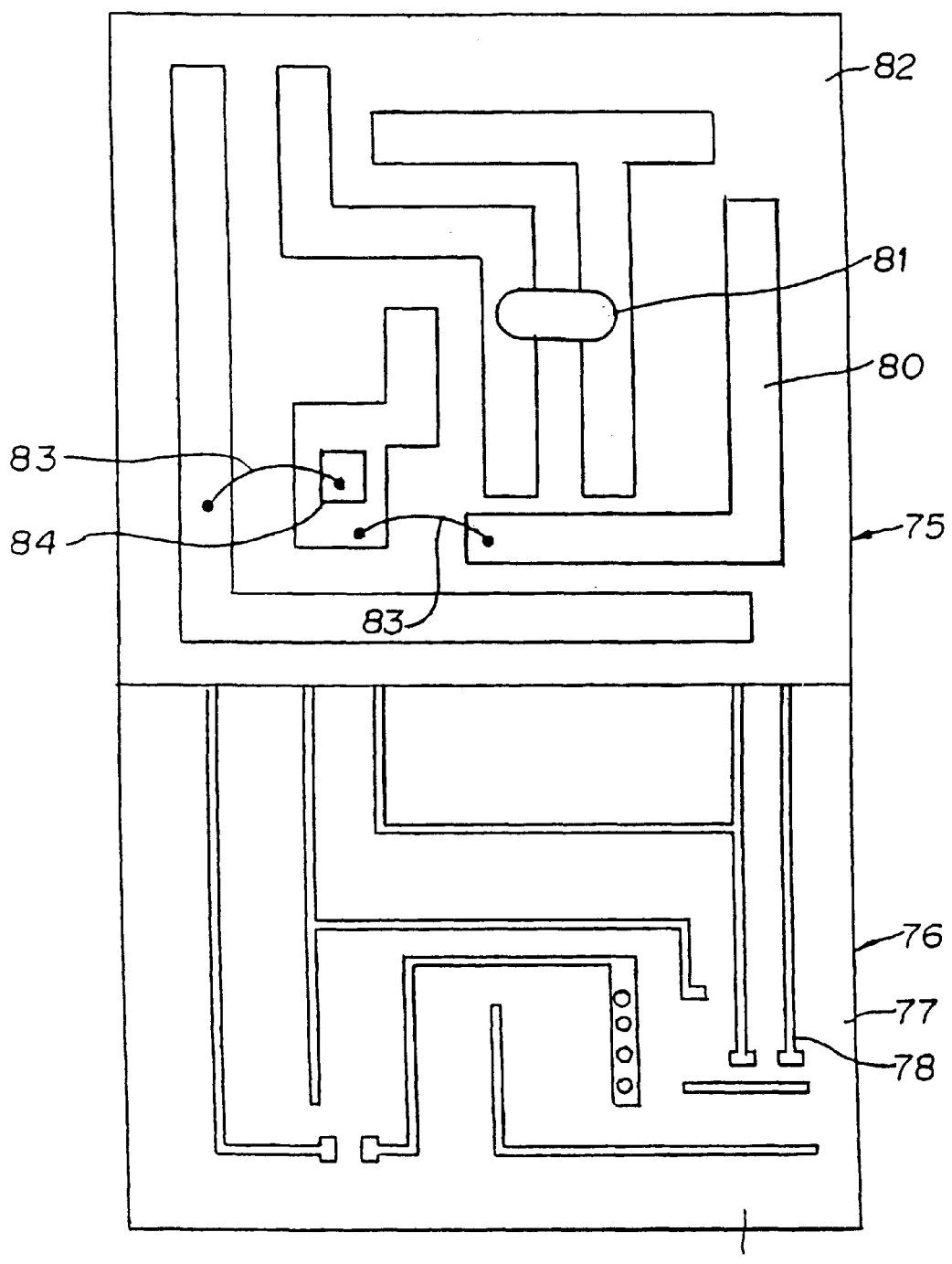
FIGS. 24A and 24B are explanatory views showing an example where the wiring construction body according to a twenty-eighth embodiment is molded.

Next, a description is made for Embodiment 28 of the present invention. FIG. 24A shows an example that a wiring construction body 75 is molded. In the figure, the reference numeral 79 indicates a molding material. Description is made below for molding to the wiring construction body.

A copper material (thickness: 20 mm, length: 100 mm, width: 80 mm), which is a material with high electric conductivity, is set in a milling machine, and a groove section (depth: 2.0 mm) is formed with an end mill (machining diameter: φ1.0 mm). Furthermore epoxy resin (YZ3727/YH3724: Produced by Ryoden Kasei), which is in a liquid phase under the room temperature, is poured into the groove section formed therein, and the resin is heated for curing for 2 hours under the temperature of 140° C. The processed material is cut with a plane perpendicular to a direction of depth of the groove section at a position 1.00 mm apart from the edge face for processing.

Then, as shown in FIG. 24A, a circuit board 76 to be electrically connected to a conductor pattern 80 of the wiring construction body 75 is previously prepared, the circuit board 76 and the wiring construction body 75 are electrically connected to each other with a reflow soldering process, and parts (a bare chip 84 or others) are incorporated therein. Then, the circuit board 76 and the wiring construction body 75 are molded by the molding material 79. It should be noted that, designated at the reference numeral 77 is an insulator, at 78 a conductor pattern, at 81 a resistor, at 82 a section filled with resin, and at 83 a wire for wiring.

Figure 24B:
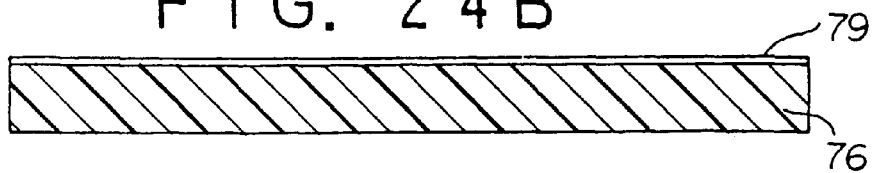

With the present embodiment, as shown in FIG. 24B, rigidity with a molding material 79 is added to a substrate by molding and warping in the substrate can be reduce thereby, which makes it possible to form a high-reliability wiring construction body 75 as well as circuit board 76.

It should be noted that a wiring construction body and a method of manufacturing the same, and a circuit board using the wiring construction body according to the present invention are not limited to ones disclosed in each of the embodiments described above, various modifications thereof can be made within the scope of the claims. Description is made below for each embodiment.

In Embodiment 1, description thereof assumes an example of a form of the conductor pattern in FIG. 1A, but a form of the conductor pattern is not limited to the form described above, and various modifications thereof are possible within the scope of the claims. Also, description therein assumes a case where a thickness of the conductor is 20 mm, but the thickness thereof is not limited to 20 mm, and a thicker one or a thinner one than that described above is allowed within the scope of the claims.

In Embodiment 2, description thereof assumes an example where a base is attached to the lower section of the wiring construction body, but not limited to this example, and the base can be attached to any part of a top surface or both surfaces of a top and a bottom, or a portion of any surface thereof.

In Embodiment 3, description thereof assumes an example where the upper section of the wiring construction body is coated, but the material is not limited to this example, and coating can be executed to any part of a top surface or both surfaces of a top and a bottom, or a portion of any surface thereof.

In Embodiment 4, description thereof assumes an example where a copper material is used as a material with high electric conductivity, but it is not limited to the copper material, and any other material such as brass, copper alloy, aluminum as well as aluminum alloy, iron as well as iron-based alloy, zinc as well as zinc alloy, silver as well as silver-based alloy, and gold as well as gold-based alloy can be used within the scope of the claims.

In Embodiment 5, description thereof assumes an example where a double-faced adhesive material is used as adhesive, but it is not limited to the double-faced adhesive material, and any other material such as epoxy-based adhesive, acrylic-based adhesive, hot-melt-based adhesive, and, a rubber-based adhesive can be used.

In Embodiment 6, description thereof assumes a case where two pieces of conductors are indicated therein as a number of conductor, but a number of conductors is not limited to two pieces, and any number thereof such as three pieces or four pieces or more within a practical range is allowable without any limitation thereto within the scope of the claims.

In Embodiment 7, description thereof assumes an example of using three layers as a material, but even if two layers or more layers are used, the same effects as described above can be obtained.

In Embodiment 8, description thereof assumes an example of polyamide as a resin material, but the resin material is not limited to polyamide, any other resin and almost all types of plastics such as PBT, phenol, polyethylene, and polypropylene can be applied thereto.

In Embodiment 9, description thereof assumes an example of aluminum as an easily-processable material, but the easily-processable material is not limited to aluminum, and any easily-processable material such as brass or iron can be applied.

In Embodiment 10, description thereof assumes an example of three-layered structure, but the structure is not limited to a three-layered structure, and two-layered or four-layered or more structure is allowable.

In Embodiment 11, description thereof assumes an example of a double-faced plate material connected to each other with a through-hole, but it is not limited to this example, and any other multilayered plate can be used.

In Embodiment 12, description thereof assumes an example of five layers each comprising a double-faced plate material connected to each other with a through-hole, but it is not limited to this example, and any of those with two layers or more is allowable.

In Embodiment 13, description thereof assumes an example of four layers of a double-faced plate material connected to each other with a through-hole and a thick conductor 53, but it is not limited to this example, and one layer or more in each of the plates are allowable.

In Embodiment 14, description thereof assumes an example of polypropylene as a material for a base, but the material for a base is not limited to polypropylene, and any other material such as polyolefine-based material such as polyethylene, silicone-based material, or Teflon-based material can be used within the scope of the claims.

In Embodiment 16, description thereof assumes an example of a silicon-based mold-releasing agent as a mold-releasing agent, but the mold-releasing agent is not limited to the silicon-based mold-releasing agent, and any other material such as a fat-based material, Teflon-based material, or inorganic-based material can be used within the scope of the claims.

In Embodiment 17, description thereof assumes an example of Araldite AV138/HV998 as adhesive, but the adhesive is not limited to Araldite AV138/HV998, and any other material such as acrylic-based adhesive, other epoxy-based adhesive, rubber-based adhesive, and hot-melt-based adhesive can be used within the scope of the claims.

In Embodiment 18, description thereof assumes an example of KE1204 (: Produced by Shin'etsu Kagaku) as adhesive, but the adhesive is not limited to KE1204 (: Produced by Shin'etsu Kagaku), and any material having such characteristics that adhesive force between metal materials or a metal material and resin material is large before cured, and adhesion between adhesive and epoxy resin becomes lower after having been cured is allowable within the scope of the claims.

In Embodiment 19, description thereof assumes an example of 3195 (: Produced by Nitto Denko) as foaming adhesive, but the foaming adhesive is not limited to 3195 (: Produced by Nitto Denko), and any adhesive in which adhesive force is remarkably reduced by being processed for foaming is allowable.

In Embodiment 20, description thereof assumes an example of copper-iron-copper in this order as a material for a clad structure, but the clad structure is not limited to this example, and as a material for structure, for instance, any of those such as brass, copper alloy, aluminum as well as aluminum alloy, iron as well as iron-based alloy, zinc as well as zinc alloy, silver as well as silver-based alloy, gold as well as gold-based alloy, and molybdenum can be used.

In Embodiment 21, description thereof assumes an example where a terminal base, a nut for fixing and a conductor pattern are simultaneously filled with resin, but it is not limited to this example, and other parts can simultaneously be imbedded in insulating resin, or can be fixed with resin.

As clearly understood from the description above, with the present invention, a thick conductor can precisely be formed, so that a high-precision circuit board for application of a large current can be formed, and also connection between the board and a control substrate is easily executed, so that a circuit board with a fine pattern integrated therein can easily be formed. Furthermore in a manufacturing method thereof, by applying a particular double-faced adhesive material, a circuit board having high processability can be manufactured, which in turn makes it possible to produce various types of products with a small lot, as well as to achieve automation, labor-saving, and production of a circuit board with a small number of parts.

As described above, in the wiring construction body according to an embodiment of the preset invention, one or a plurality of circuit pattern conductors each formed into a prespecified form and mechanically connected to each other with insulating resin are provided and the circuit patterns are formed on two surfaces thereof, so that the circuit pattern has high-precision, a control current and a large current can be applied thereto, and incorporation with small number of parts can be realized. Also a desired circuit pattern can be formed, each circuit conductor are insulated from each other, and at the same time the circuit conductors can monolithically be formed, and for this reason electrical connection between the top surface and the bottom surface of a wiring construction body becomes easier.

In the wiring construction body according to another embodiment of the present invention, an insulating base is adhered to one of the two surfaces on which circuit patterns are formed, so that rigidity of the wiring construction body can be enhanced, and one of the surfaces of the wiring construction body can be insulated by using an insulating base for fixing, which makes it possible to be effectively contacted with and fixed to a conductive radiation fin or the like.

In the wiring construction body according to another embodiment of the present invention, an insulating coating is applied to one of or both the two surfaces on which the circuit patterns are formed, so that insulation of the wiring construction body can further be enhanced, an area of joint by soldering can be controlled, and furthermore moisture resistance can be improved.

In the method of manufacturing the wiring construction body according to another embodiment of the present invention, the wiring construction body is not affected by side etching like in a case where a pattern is formed by etching a copper material, dimension precision in forming a circuit pattern can be better, and a groove processing can easily be executed, which makes it possible to form a desired circuit pattern. In addition, epoxy resin is injected to the groove section formed in the copper material, circuit patterns each subjected to groove processing by cutting the precessed works described above with a vertical surface to the direction of the depth of the groove section can monolithically be formed in a stable state so that the patterns will not go to pieces and positional displacement thereof never occurs, conductor patterns each subjected to groove processing and separated from the peripheral conductors thereby can be insulated as a circuit pattern, and at the same time can monolithically be formed by integrating all of them together by adhering, which makes it possible to obtain a wiring construction body enabling application of a large current thereto.

The method of manufacturing the wiring construction body according to another embodiment of the present invention comprises a step of adhering or fixing the material with high electric conductivity to the base for processing, and a step of separating the material with high electric conductivity from the base for processing, so that the copper material and the base for processing are connected to each other with an adhesive, and for this reason the base for processing and the portion of wiring construction body can easily be separated from each other, which makes it possible to improve workability thereof.

The method of manufacturing the wiring construction body according to another embodiment of the present invention comprises a step of adhering or fixing a plurality of the same types or different types of the material with high electric conductivity to the base for processing, and a step of separating the formed material with high electric conductivity from the base for processing, so that, as compared to a case where a circuit pattern is formed by providing the material with high electric conductivity on the entire surface thereof, a processing rate can be reduced by providing the material with high electric conductivity for each block, and for this reason a wiring construction body can effectively be manufactured.

In the method of manufacturing the wiring construction body according to another embodiment of the present invention, a plurality of materials with high electric conductivity are laminated and adhered to each other, and a laminated body made from the material with high electric conductivity is used so that the laminated material with high electric conductivity will be adhered and fixed to the base for processing, and for this reason a plurality of wiring construction body can effectively and easily be obtained.

The method of manufacturing the wiring construction body according to another embodiment of the present invention comprises steps of laminating and adhering a plurality of materials with high electric conductivity and a plurality of resin plates to each other in a staggered format, adhering and fixing the laminated material to the base for processing, and a portion of the resin described above is processed, so that processability thereof is excellent and the resin portion can easily be separated from each other, which makes it possible to improve the workability thereof.

The method of manufacturing the wiring construction body according to another embodiment of the present invention comprises steps of alternately laminating a plurality of materials with high electric conductivity and a plurality of easily-processable metal plates and adhering the materials and the metal plates to each other, and adhering or fixing the laminated material to the base for processing, and a step of separating easily-processable metal plates, so that it is possible to easily separate a wiring construction body by processing the easily-processable portion formed in each layer.

The method of manufacturing the wiring construction body according to another embodiment of the present invention comprises a step of laminating and adhering to each other a plurality of the same types or different types of materials with high electric conductivity and adhering or fixing the laminated material to the base for processing, a step of separating a top layer of the formed laminated materials and adhering or fixing the top layer to other base for processing, a step of separating other base for processing, then a step of repeating a series of steps from the steps described above and on several times, so that separation of the wiring construction body from each other becomes extremely easier, which makes it possible to obtain a plurality of wiring construction bodies in a short period of time.

The method of manufacturing the wiring construction body according to another embodiment of the present invention comprises a step of providing conductor plates on both surfaces of an insulating material and adhering a double-faced substrate with the conductor plates on both surfaces electrically connected to each other with a through-hole to a base for processing, which makes it possible to form a substrate of a thick conductor with higher resistance against a heat cycle;

The method of manufacturing the wiring construction body according to another embodiment of the present invention comprises a step of adhering to each other a plurality of double-faced substrates each with conductor plates provided on both surfaces of an insulating material and electrically connected to each other with a through-hole, so that the conductor can be made thicker, a large current can electrically be applied thereto, and at the same time a substrate of a thick conductor with higher resistance against a heat cycle can be formed.

The method of manufacturing the wiring construction body according to another embodiment of the present invention comprises a step of electrically connecting and at the same time mechanically jointing a double-faced substrate with conductor plates provided on both surfaces of an insulating material, the conductor plates on both surfaces electrically connected to each other with a through-hole to thick materials with high electric conductivity, so that the conductor can be made thicker, a large current can electrically be applied thereto, and at the same time a substrate of a thick conductor with higher resistance against a, heat cycle can be formed.

In the method of manufacturing the wiring construction body according to another embodiment of the present invention, the base for processing is made of resin having a small adhesion to the insulating resin filled in the groove section, so that the base for processing and the wiring construction body are easily separated from each other, which makes it possible to remarkably improve the workability thereof.

In the method of manufacturing the wiring construction body according to another embodiment of the present invention, the base for processing is made of polyolefin-based resin, silicon-based resin, or fluorine-based resin, so that the base for processing and the wiring construction body are easily separated from each other, which makes it possible to remarkably improve the workability thereof.

In the method of manufacturing the wiring construction body according to another embodiment of the present invention, a surface of the base for processing is processed with a mold-releasing agent, so that an adhesive force between the base for processing and epoxy resin can further be made smaller, which makes it possible to extremely easily separate the wiring construction body from the base for processing.

In the method of manufacturing the wiring construction body according to another embodiment of the present invention, an adhesive in which has an excellent adhesive force at around the room temperature, said adhesive force becoming lower when heated, is used for adhering the material with high electric conductivity to the base for processing, which makes it possible to extremely easily separate the wiring construction body from the base for processing.

In the method of manufacturing the wiring construction body according to another embodiment of the present invention, the adhesive is an epoxy-based adhesive, or a silicon-based adhesive, so that an adhesive force to epoxy resin becomes remarkably lower, which makes it possible to further easily separate the base for processing and the wiring construction body from each other.

In the method of manufacturing the wiring construction body according to another embodiment of the present invention, the adhesive is a foaming adhesive, so that the wiring construction body can easily be separated from the base for processing by heating.

In the method of manufacturing the wiring construction body according to another embodiment of the present invention, the material with high electric conductivity is a magnetic material or a clad material with a magnetic material, or a material consisting of different types of materials and including a magnetic material, and magnetism is made use of when separating the material with high electric conductivity in which a groove section for forming a circuit pattern is formed from a base for processing or other material with high electric conductivity in which a groove section is formed, so that a step of separation becomes easier. Also a three-layered clad material is used as a material with high electric conductivity, so that any material can be selected, which makes it possible to add various characteristics to the wiring construction body.

In the method of manufacturing, the wiring construction body according to another embodiment of the present invention, in a case where the insulating resin is filled in the groove section, a desired component is simultaneously imbedded in the groove section or in a section around the groove section in which the resin is poured in, so that fixing components from the next steps and on can be omitted, which makes it possible to improve workability thereof.

In the method of manufacturing the wiring construction body according to another embodiment of the present invention, a groove is formed with a machining tool having a diameter equal to the insulating range in the material with high electric, so that labor-saving and efficiency in a groove processing can be achieved. Furthermore, steps of groove processing can be executed more efficiently.

The method of manufacturing the wiring construction body according to another embodiment of the present invention comprises a step of specifying coordinate values for a central line of a conductor pattern, a step of specifying coordinate values for a start point and an end point on the central line of the conductor pattern, a step of specifying coordinate values for the central line of the adjoining conductor pattern, a step of specifying coordinate values for a start point and an end point on the central line for the adjoining conductor pattern, a step of specifying a potential difference between the conductor pattern and the adjoining conductor pattern, a step of setting an insulating range between conductors by converting a potential difference between the conductor pattern and the adjoining conductor pattern to an insulating range between conductors, a step of setting an external diameter of a machining tool according to the insulating range, a step of computing a groove machining route according to the external diameter of the machining tool, and a step of storing the computed groove machining route, so that a desired circuit pattern can efficiently be obtained.

The method of manufacturing the wiring construction body according to another embodiment of the present invention comprises a step of specifying coordinate values for a central line of a conductor pattern, a step of specifying coordinate values for a start point and an end point on the central line of the conductor pattern, a step of specifying coordinate values for the central line of the adjoining conductor pattern, a step of specifying coordinate values for a start point and an end point on the central line for the adjoining conductor pattern, a step of specifying a potential difference between the conductor pattern and the adjoining conductor pattern, a step of setting an insulating range between conductors by converting a potential difference between the conductor pattern and the adjoining conductor pattern to an insulating range between conductors, a step of setting an external diameter of a machining tool according to the insulating range, a step of computing a groove machining route according to the external diameter of the machining tool, a step of storing the computed groove machining route, and a step of setting a resin pouring route depending on the stored groove machining route, so that inputting coordinate values for a pouring position at a tip section of a dispenser for pouring resin is omitted, which makes it possible to achieve efficiency of resin pouring operation.

In the circuit board using the wiring construction body according to another embodiment of the present invention, one or a plurality of circuit pattern conductors each formed into a prespecified form and mechanically connected to each other with insulating resin are provided, and in the wiring construction body in which the circuit patterns are formed on two surfaces, the wiring construction body with the plurality of circuit pattern conductors integrated with each other is electrically connected, or electrically connected and mechanically fixed to a printed circuit board, so that dimensional precision for forming patterns is improved, and also a high-precision circuit board for a fine pattern or a large current pattern can be formed by applying the wiring construction body formed by improving precision of the thick material with high electric conductivity, and by electrically connecting the both of them to each other.

In the circuit board using the wiring construction body according to another embodiment of the present invention, a prespecified circuit pattern is formed by forming a groove section in a plurality of materials with high electric conductivity, the material with high electric conductivity are provided in a plane form, the insulating resin is filled in the groove section formed with the materials with high electric conductivity, the wiring construction body with the plurality of materials with high electric conductivity integrated to each other is electrically connected, or electrically connected and mechanically fixed to a printed circuit board so that a portion of the materials with high electric conductivity will protrude from an external peripheral of the wiring construction body, so that a range where a wiring construction body and a circuit board can be applied is expanded, and a number of required parts can be reduced.

In the circuit board using the wiring construction body according to another embodiment of the present invention, a bare chip is directly jointed to a conductor section of the wiring construction body, so that a heat spreader in an incorporated portion in the large current section is not required, and a number of required parts can be reduced.

In the circuit board using the wiring construction body according to another embodiment of the present invention, a portion of or the entire section of the wiring construction body is molded, so that a warp in the board is reduced by adding thereto the rigidity due to a molded material, which makes it possible to form a high-reliability wiring construction body as well as circuit board.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A wiring construction body, having an upper surface and a lower surface, comprising:
    a plurality of circuit pattern conductors disposed within said body, at least one of said circuit pattern conductors for connecting at least two circuit elements at different locations on the same surface of said wiring construction body, each of said conductors extending vertically through said body from said upper surface to said lower surface and horizontally across said body to form respective prespecified circuit patterns of conductive lines on the upper and lower surfaces of said body for conducting current in both a horizontal direction and a vertical direction with respect to said body, said conductors being mechanically connected to each other within said body by insulating resin.

2. A wiring construction body according to claim 1, further comprising an insulating base adhered to one of said two surfaces on which said circuit patterns are formed.

3. A wiring construction body according to claim 1, further comprising an insulating coating applied to at least one of the two surfaces on which said circuit patterns are formed.

4. A wiring construction body according to claim 1, wherein said circuit pattern conductors are formed of a conducting material, said circuit pattern conductors having a thickness of approximately 0.1–0.5 mm.

5. A wiring construction body according to claim 1, wherein said circuit pattern conductors are formed of a conducting material, said circuit pattern conductors having a thickness of approximately 0.5 mm.

6. A wiring construction body, having an upper surface and a lower surface, for use with a circuit board, said wiring construction body comprising:
    one or more circuit pattern conductors, at least one of said conductors for connecting at least two circuit elements at different locations on the same surface of said wiring construction body, said conductors extending vertically through said body from said upper surface to said lower surface and horizontally across said body to form respective prespecified circuit patterns of conductive lines on said upper and lower surfaces of said body for conducting current in both a horizontal direction and a vertical direction with respect to the wiring construction body;
    the one or more circuit pattern conductors being connected to each other with insulating resin and forming different prespecified circuit patterns on the upper and lower surfaces of the wiring construction body; and
    the wiring construction body being electrically connectable to the circuit board.

7. A device according to claim 6, further comprising a bare chip directly joined to one or more of said circuit pattern conductors of said wiring construction body.

8. A device according to claim 6, wherein said wiring construction body is a molded body.

9. A device according to claim 6, wherein a portion of said wiring construction body is a molded body.

10. A device according to claim 6, wherein the wiring construction body is mechanically connectable to the circuit board.

11. A wiring construction body according to claim 6, wherein said circuit pattern conductors are formed of a conducting material, said circuit pattern conductors having a thickness of approximately 0.1–0.5 mm.

12. A wiring construction body according to claim 6, wherein said circuit pattern conductors are formed of a conducting material, said circuit pattern conductors having a thickness of approximately 0.5 mm.

13. A wiring construction body, having an upper surface and a lower surface, for use with a circuit board, said wiring construction body comprising:
    a prespecified circuit pattern of conductive lines, at least one of said conductive lines for connecting at least two circuit elements at different locations on the same surface of said wiring construction body, said conductive lines defined by a groove section in a plurality of materials having high electric conductivity and, said materials with high electric conductivity extending vertically through said wiring construction body from said upper surface to said lower surface and horizontally across the wiring construction body for conducting current in both a horizontal direction and a vertical direction with respect to the wiring construction body; and an insulating resin disposed in said groove section and integrating said materials within said wiring construction body;

wherein said wiring construction body is connectable to said circuit board, a portion of one of said materials with high electric conductivity protruding from an external periphery of said wiring construction body.

14. A wiring construction body according to claim 13, wherein said wiring construction body is mechanically connectable to the circuit board.

15. A wiring construction body according to claim 13, wherein said conductive lines have a thickness of approximately 0.1–0.5 mm.

16. A wiring construction body according to claim 13, wherein said conductive lines have a thickness of approximately 0.5 mm.

* * * * *